(12) United States Patent
Ipek et al.

(10) Patent No.: US 10,552,756 B2
(45) Date of Patent: Feb. 4, 2020

(54) SUPERCONDUCTING SYSTEM ARCHITECTURE FOR HIGH-PERFORMANCE ENERGY-EFFICIENT CRYOGENIC COMPUTING

(71) Applicants: Engin Ipek, Rochester, NY (US); Ben Feinberg, Rochester, NY (US); Shibo Wang, Rochester, NY (US); Mahdi N. Bojnordi, Rochester, NY (US); Ravi Patel, Victor, NY (US); Eby G. Friedman, Rochester, NY (US)

(72) Inventors: Engin Ipek, Rochester, NY (US); Ben Feinberg, Rochester, NY (US); Shibo Wang, Rochester, NY (US); Mahdi N. Bojnordi, Rochester, NY (US); Ravi Patel, Victor, NY (US); Eby G. Friedman, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 15/774,503

(22) PCT Filed: Nov. 10, 2016

(86) PCT No.: PCT/US2016/061292
§ 371 (c)(1),
(2) Date: May 8, 2018

(87) PCT Pub. No.: WO2018/009240
PCT Pub. Date: Jan. 11, 2018

(65) Prior Publication Data
US 2019/0188596 A1 Jun. 20, 2019

Related U.S. Application Data

(60) Provisional application No. 62/254,546, filed on Nov. 12, 2015.

(51) Int. Cl.
*G06N 10/00* (2019.01)
*G06F 7/38* (2006.01)
(Continued)

(52) U.S. Cl.
CPC .............. *G06N 10/00* (2019.01); *G06F 7/381* (2013.01); *G06F 9/3004* (2013.01);
(Continued)

(58) Field of Classification Search
CPC ........ G06N 10/00; H03K 19/195; G11C 19/32; G11C 11/44; G11C 11/1675;
(Continued)

(56) References Cited

U.S. PATENT DOCUMENTS

| 10,222,416 B1* | 3/2019 | Inamdar | ............ G01R 31/31712 |
| 2004/0022332 A1* | 2/2004 | Gupta | ................. H04B 1/0003 |
| | | | 375/343 |

(Continued)

OTHER PUBLICATIONS

Van Duzer, Theodore, et al., "64-kb Hybrid Josephson-CMOS 4 Kelvin RAM with 400 ps Access Time and 12 mW Read Power," 2013, IEEE Transactions on Applied Superconductivity, vol. 23, No. 3, (4 pgs.).

(Continued)

*Primary Examiner* — Don P Le
(74) *Attorney, Agent, or Firm* — Harris Beach PLLC

(57) ABSTRACT

An energy efficient rapid single flux quantum (ERSFQ) logic register wheel includes a circular shift register having a plurality of destructive read out (DRO) cells. Each entry of the circular shift register includes a data block, a tag, and a valid bit. A compare and control logic is coupled to the circular shift register to compare a source specifier or a destination register specifier against a register tag stored in the wheel following each cycle of the register wheel. At least one or more read ports and at least one or more write ports
(Continued)

are coupled to the circular shift register to write to or to read from a different entry each in the register wheel following each cycle of the register wheel. A RSFQ clearable FIFO with flushing and a crosspoint memory topology for integrating MRAM devices with ERSFQ circuits are also described.

12 Claims, 25 Drawing Sheets

(51) Int. Cl.
| | |
|---|---|
| H01L 39/22 | (2006.01) |
| G06F 9/30 | (2018.01) |
| G11C 11/16 | (2006.01) |
| G11C 11/44 | (2006.01) |
| G11C 19/32 | (2006.01) |
| H03K 19/195 | (2006.01) |
| H01L 27/18 | (2006.01) |
| H01L 27/22 | (2006.01) |
| H01L 43/02 | (2006.01) |

(52) U.S. Cl.
CPC ........ *G06F 9/3016* (2013.01); *G06F 9/30105* (2013.01); *G11C 11/161* (2013.01); *G11C 11/1673* (2013.01); *G11C 11/1675* (2013.01); *G11C 11/44* (2013.01); *G11C 19/32* (2013.01); *H01L 39/223* (2013.01); *H03K 19/195* (2013.01); *H01L 27/18* (2013.01); *H01L 27/222* (2013.01); *H01L 43/02* (2013.01)

(58) Field of Classification Search
CPC . G11C 11/1673; G11C 11/161; G06F 9/3016; G06F 9/30105; G06F 9/3004; G06F 7/381; G06F 1/16; H01L 39/223; H01L 43/02; H01L 27/222; H01L 27/18
USPC ............................................................. 326/6
See application file for complete search history.

(56) References Cited

U.S. PATENT DOCUMENTS

| | | | | |
|---|---|---|---|---|
| 2009/0322374 | A1* | 12/2009 | Przybysz | G06N 10/00 326/5 |
| 2012/0184445 | A1 | 7/2012 | Mukhanov et al. | |
| 2015/0146805 | A1* | 5/2015 | Terry | H04L 25/0204 375/260 |

OTHER PUBLICATIONS

Vernik, Igor V., et al., "Magnetic Josephson Junctions with Superconducting Interlayer for Cryogenic Memory," 2013, IEEE Transactions on Applied Superconductivity, vol. 23, No. 3. (8 pgs.).
Wilton, Steven J.E., et al., "CACTI: An Enhanced Cache Access and Cycle Time Model," 1996, IEEE Journal of Solid-State Circuits, vol. 31, No. 5, (pp. 677-688).
Woo, Steven Cameron, et al., "The SPLASH-2 Programs: Characterization and Methodological Considerations," 1995, In Computer Architecture 1995. Proceedings., 22nd Annual International Symposium (pp. 24-36).
Yamada, Tatsuji, et al., "Quantitative Evaluation of the Single-Flux-Quantum Cross/Bar Switch," 2005 IEEE Transactions on Applied Superconductivity, vol. 15, No. 2, (4 pgs.).
Yamanashi, Y., et al., "Design and Implementation of a Pipelined Bit-Serial SFQ Microprocessor, CORE1 β," 2007, IEEE Transactions on Applied Superconductivity, vol. 17, No. 2, (pp. 474-477).
Yoo, Richard M., et al., "Phoenix Rebirth: Scalable MapReduce on a Large-Scale Shared-Memory System," 2009, In Workload Characterization 2009. IISWC 2009. IEEE International Symposium (pp. 198-207).

Yorozu, S., et al., "Progress of Single Flux Quantum Packet Switch Technology," 2005, IEEE Transactions on Applied Superconductivity, vol. 15, No. 2, (pp. 411-414).
Yorozu, Shinichi, et al., "A Single Flux Quantum (SFQ) Packet Switch Unit towards Scalable Non-blocking Router," 2002, IEICE Transactions on Electronics, vol. E85-C, No. 3, (pp. 617-620).
Yorozu, S., et al., "A 40GHz clock 160Gb/s 4x4 switch circuit using single flux quantum technology for high-speed packet switching systems," 2004, In High Performance Switching and Routing, 2004. HPSR. 2004 Workshop (pp. 20-23).
Yorozu, S., et al., "Single Flux quantum circuit technology innovation for backbone router applications," 2003, Physica C: Superconductivity, (pp. 392-396, Part 2(0): 1478-1484).
Zhao, Wei, et al., "New Generation of Predictive Technology Model for Sub-45nm Design Exploration," 2006, IEEE Transactions on Electron Devices, vol. 53, No. 11, (6 pages).
Zimmerman, J.E., "Space applications of superconductivity: low frequency superconducting sensors," 1980, Cryogenics, vol. 20, No. 1, (pp. 3-10).
Zinoviev, Dmitry Y., et al., "Feasibility Study of RSFQ-based Self-Routing Nonblocking Digital Switches," 1997, IEEE Transactions on Applied Superconductivity, vol. 7, No. 2., (pp. 3155-3163).
Zotev, Vadim S., et al., "Multi-Channel SQUID System for MEG and Ultra-Low-Field MRI," 2007, IEEE Transactions on Applied Superconductivity, vol. 17, No. 2, (pp. 839-842).
Zotev, Vadim S., et al., "SQUID-based instrumentation for ultralow-field MRI," 2007, Superconductor Science and Technology, vol. 20, No. 11, (pp. S367-S373).
Zotev, Vadim S., et al., "Microtesla MRI of the human brain combined with MEG," 2008, Journal of Magnetic Resonance, vol. 194, No. 1, (14 pgs.).
Gaj, Kris, et al., "Tools for the Computer-Aided Design of Multigigahertz Superconducting Digital Circuits," 1999, IEEE Transactions on Applied Superconductivity, vol. 9, No. 1, (pp. 18-38).
Gaj, Krzysztof, et al., "A Clock Distribution Scheme for Large RSFQ Circuits," 1995, IEEE Transactions on Applied Superconductivity, vol. 5, No. 2., (pp. 3320-3324).
Silver, Arnold H., "Superconductor Technology for High-End Computing System Issues and Technology Roadmap," 2005, Proceedings of the ACM/IEEE SC/05 Conference, (4 pages).
Engel, B.N., et al., "A 4-Mb Toggle MRAM Based on a Novel Bit and Switching Method," 2005, IEEE Transactions on Magnetics, vol. 41, No. 1, (pp. 132-136).
Hosomi, M., et al., "A Novel Nonvolatile Memory with Spin Torque Transfer Magnetization Switching: Spin-RAM," 2005, IEDM Technical Digest, (4 pages).
Kishi, T., et al., "Lower-current and Fast switching of A Perpendicular TMR for High Speed and High density Spin-Transfer-Torque MRAM," 2008, Proceedings of the IEEE International Electron Devices Meeting, (4 pages).
Kawahara, Takayuki, et al., "2 Mb SPRAM (SPin-Transfer Torque RAM) With Bit-by-Bit Bi-Directional Current Write and Parallelizing-Direction Current Read," 2008, IEEE Journal of Solid-State Circuits, vol. 43, No. 1, (pp. 109-120).
Liang, Jiale, et al., "Effect of Wordline/Bitline Scaling on the Performance, Energy Consumption, and Reliability of Cross-Point Memory Array," 2013, ACM Journal on Emerging Technologies in Computing Systems, vol. 9, No. 1, Article 9, (14 pages).
Ayala, Christopher Lawrence, "Energy-Efficient Wide Datapath Integer Arithmetic Logic Units Using Superconductor Logic," 2012, PhD Thesis, Stony Brook University (173 pgs.).
Bailey, D.H., et al., "The NAS Parallel Benchmarks—Summary and Preliminary Results," 1991, Supercomputing '91. Proceedings of the 1991 ACM/IEEE Conference (pp. 158-165).
Bakolo, Rodwell S., "Design and Implementation of RSFQ Superconductive Digital Electronics Cell Library," 2011, PhD Thesis, University of Stellenbosch (150 pgs).
Bienia, Christian, et al., "The PARSEC Benchmark Suite: Characterization and Architectural Implications," 2008, In Proceedings of the 17th International Conference on Parallel Architectures and Compilation Techniques (8 pgs.).
Brock, Darren K., et al., "Superconductor ICs: the 100-GHz second generation," 2000, IEEE Spectrum (12 pgs.).

(56) References Cited

OTHER PUBLICATIONS

Bronk, Christopher, et al., "Innovation for Sustainability in Information and Communication Technologies (ICT)," 2010, James A. Baker III Inst. Public Policy, Rice Univ., Houston, TX (7 pgs.).

Bunyk, Paul, et al., "FLUX-1 RSFQ Microprocessor: Physical Design and Test Results," 2003, IEEE Transactions on Applied Superconductivity, vol. 13, No. 2 (pp. 433-436).

Caufield, H. John, et al., "Why future supercomputing requires optics," 2010, Nature Photonics, vol. 4 (pp. 261-263).

Chen, W., et al., "Rapid Single Flux Quantum T-Flip Flop Operating up to 770 GHz," 1999, IEEE Transactions on Applied Superconductivity, vol. 9 (pp. 3212-3215).

Dagum, Leonardo, et al., "OpenMP: An Industry-Standard API for Shared-Memory Programming," 1998, IEEE Computational Science & Engineering (pp. 46-55).

Dorojevets, Mikhail, et al., "Data-Flow Microarchitecture for Wide Datapath RSFQ Processors: Design Study," 2011, IEEE Transactions on Applied Superconductivity, vol. 21, No. 3 (pp. 787-791).

Dorojevets, Mikhail, et al., "8-Bit Asynchronous Sparse-Tree Superconductor RSFQ Arithmetic-Logic Unit With a Rich Set of Operations," 2013, IEEE Transactions on Applied Superconductivity, vol. 23, No. 3 (4 pgs.).

Dorojevets, Mikhail, et al., "COOL-0: Design of an RSFQ Subsystem for Petaflops Computing," 1999, IEEE Transactions on Applied Superconductivity, vol. 9, No. 2 (pp. 3606-3614).

Dorojevets, Mikhail, et al., "Architectural and Implementation Challenges in Designing High-Performance RSFQ Processors: A FLUX-1 Microprocessor and Beyond," 2003, IEEE Transactions on Applied Superconductivity, vol. 13, No. 2 (pp. 446-449).

Dorojevets, Mikhail, et al., "20-GHz 8×8 Parallel Carry-Save Pipelined RSFQ Multiplier," 2013, IEEE Transactions on Applied Superconductivity, vol. 23, No. 3 (4 pgs).

Dorojevets, M., "A 20-GHz FLUX-1 superconductor RSFQ microprocessor," 2002, J. Phys. IV France, vol. 12 (pp. 157-160).

Dubash, Noshir B., et al., "SFQ Data Communication Switch," 1997, IEEE Transactions on Applied Superconductivity, vol. 7, No. 2 (pp. 2681-2684).

Espy, M.A., et al., "Ultra-low-field MRI for the detection of liquid explosives," 2010, Superconductor Science and Technology, vol. 23 (10 pgs.).

Hamilton, Clark A., "Josephson voltage standards," 2000, Review of Scientific Instruments, vol. 71 (pp. 3611-3623).

Haverkamp, Imke, et al., "Linearity of a Digital SQUID Magnetometer," 2011, IEEE Transactions on Applied Superconductivity, vol. 21, No. 3 (pp. 705-708).

Herr, Quentin P., et al., "Implementation and Application of First-In First-Out Buffers," 2003, IEEE Transactions on Applied Superconductivity, vol. 13., No. 2 (pp. 563-566).

Kameda, Yoshio, et al., "Design and Demonstration of a 4×4 SFQ Network Switch Prototype System and 10-Gbps Bit-Error-Rate Measurement," 2008, IEICE Trans. Electron., vol. E91-C, No. 3 (pp. 333-341).

Lawrence, R.D., et al., "A Scalable Parallel Algorithm for Self-Organizing Maps with Applications to Sparse Data Mining Problems," 1999, Data Mining and Knowledge Discovery, vol. 3 (pp. 171-195).

Lenz, James, et al., "Magnetic Sensors and Their Applications," 2006, IEEE Sensors Journal, vol. 6, No. 3 (pp. 631-649).

Likharev, K.K, et al., "RSFQ Logic/Memory Family: A New Josephson-Junction Technology for Sub-Terahertz-Clock-Frequency Digital Systems," 1991, IEEE Transactions on Applied Superconductivity, vol. 1, No. 1 (pp. 3-28).

Lin, J.C., et al., "Design of SFQ-Counting Analog-to-Digital Converter," 1995, IEEE Transactions on Applied Superconductivity, vol. 5, No. 2 (pp. 2252-2259).

Liu, Qingguo, "Josephson-CMOS hybrid memories," 2007, PhD Thesis, University of California, Berkeley (198 pgs.).

Li, Sheng, et al., "McPAT: An Integrated Power, Area, and Timing Modeling Framework for Multicore and Manycore Architectures," 2009, In Microarchitecture, MICRO-42, 42nd Annual IEEE/ACM International Symposium (pp. 469-480).

Matula, R.A., Electrical Resistivity of Copper, Gold, Palladium, and Silver, 1979, J. Phys. Chem. Ref. Data, vol. 8, No. 4 (pp. 1147-1298).

McCambridge, James D., et al., "Multilayer HTS SFQ Analog-to-Digital Converters," 1997, IEEE Transactions on Applied Superconductivity, vol. 7, No. 2 (pp. 3622-3625).

Moody, M.V., et al., "Superconducting gravity gradiometer for space and terrestrial applications," 1986, Journal of Applied Physics, vol. 60, No. 12, (pp. 4308-4315).

MOSIS, "MOSIS Packaging and Assembly: Packaging Options," 2013, http://www.mosis.com/pages/products/assembly/index. (7 pgs.).

Mukhanov, Oleg A., et al., "Superconductor Analog-to-Digital Converters," 2004, Proceedings of the IEEE, vol. 92, No. 10, (pp. 1564-1584).

Mukhanov, Oleg A., "Energy-Efficient Single Flux Quantum Technology", 2011, IEEE Transactions on Applied Superconductivity, vol. 21, No. 3, (pp. 760-769).

Muralimanohar, Naveen, et al., "CACTI 6.0: A Tool to Model Large Caches," 2009, HP Laboratories (25 pgs.).

Nakagawa, Takahiro, et. al., "Large-Scale SFQ Switches Using Miniaturized 2×2 Switch Cell", 2008, IEEE Transactions on Applied Superconductivity, vol. 18, No. 4., (pp. 1790-1796).

Nisenoff, M., "Space Applications of Superconductivity," 1992, Principles and applications of superconducting quantum interference devices, (69 pgs.).

Numata, H., et al., "A Vortex Transitional Memory Cell for 1-Mbit/cm2 Density Josephson RAMs," 1997, IEEE Transactions on Applied Superconductivity, vol. 7, No. 2., (pp. 2282-2287).

Ortlepp, T., et al., "Design guidelines for Suzuki stacks as reliable high-speed Josephson voltage drivers," 2013, Superconductor Science and Technology, vol. 26 (13 pgs.).

Polonsky, S.V., "New SFQ/DC converter for RSFQ logic/memory family," 1991, Superconductor Science and Technology, vol. 4 (pp. 442-444).

Reich, Torsten., et al., "Digital SQUID Sensor Based on SFQ Technique," 2005, IEEE Transactions on Applied Superconductivity, vol. 15, No. 2, (pp. 304-307).

Renau, Jose, et al., "SESC: cycle accurate architectural simulator," 2005, http://sesc.sourceforge.net.

Rupp, Karl, et al., "The Economic Limit to Moore's Law," 2010, Proceedings of the IEEE, vol. 98, No. 3, (pp. 351-353).

Ryazanov' Valery V., et al., "Magnetic Josephson junction technology for digital and memory applications," 2012, Physics Procedia, vol. 36, (pp. 35-41).

Sasaki, H., et al., "RSFQ-Based D/A Converter for AC Voltage Standard," 1999, IEEE Transactions on Applied Superconductivity, vol. 9, No. 2, (pp. 3561-3564).

Semenov, V.K., et al., "DC Voltage Multipliers: A Novel Application of Synchronization in Josephson Junction Arrays," 1989, IEEE Transactions on Magnetics, vol. 25, No. 2, (pp. 1432-1435).

Snyder, Wilson, et al., "Introduction to Verilator," Verilator Wiki. http://www.veripool.org/wiki/verilator.

Suzuki, M., et al., "An Interface Circuit for a Josephson-CMOS Hybrid Digital System," 1999, IEEE Transactions on Applied Superconductivity, vol. 9, No. 2, (pp. 3314-3317).

Thompson, Scott E., "Power, Cost and Circuit IP Reuse: The Real Limiter to Moore's Law Over the Next 10 Years," 2010, VLSI Technology Systems and Applications, (pp. 88-89).

Tsuga, Yuto., et al., "Asynchronous Digital SQUID Magnetometer With an On-Chip Magnetic Feedback for Improvement of Magnetic Resolution," 2013, IEEE Transactions on Applied Superconductivity, vol. 23, No. 3, (5 pgs.).

\* cited by examiner

FIG. 11

| Processor Parameters | |
|---|---|
| Fequency | 20 GHz (80 GHz wheels) |
| Number of cores | 1 |
| Number of SMT contexts | 16 per core |
| Pipeline organization | Single-issue, in-order |
| L1 Caches | |
| IL1/DL1 size | 32KB/32KB |
| IL1/DL1 block size | 32B/32B |
| IL1/DL1 round-trip latency | 1/1 cycles (uncontended) |
| IL1/DL1 associativity | 4/4 |
| Shared L2 Cache and Main Memory | |
| Shared L2 Cache | 4MB, 64B block, 16-way |
| L2 round-trip latency | 8 cycles (uncontended) |
| DRAM subsystem | Section 5.3 |
| Memory controllers | 1 |

Table 1: Parameters of the proposed architecture.

FIG. 12

| Processor Parameters | |
|---|---|
| Fequency | 4 GHz |
| Number of cores | 8 |
| Number of SMT contexts | 8 per core |
| Pipeline organization | Single-issue, in-order |
| L1 Caches | |
| IL1/DL1 size | 32KB/32KB |
| IL1/DL1 block size | 32B/32B |
| IL1/DL1 round-trip latency | 2/2 cycles (uncontended) |
| IL1/DL1 associativity | 4/4 |
| Coherence protocol | MESI |
| Shared L2 Cache and Main Memory | |
| Shared L2 Cache | 4MB, 64B block, 16-way |
| L2 round-trip latency | 10 cycles (uncontended) |
| DRAM subsystem | DDR3-1600 SDRAM [57] |
| Memory controllers | 4 |

Table 2: Parameters of baseline.

| Benchmark | Problem size |
|---|---|
| Data Mining | |
| Bsom | 2,048 rec., 100 epochs |
| Phoenix | |
| Linear regression | 50MB points |
| Histogram | 34,843,392 pixels (104MB) |
| SPLASH-2 | |
| Barnes | 16K Particles |
| FFT | 1M points |
| FMM | 16K particles |
| LU | 512×512 matrix, 16×16 blocks |
| Ocean | 514×514 ocean |
| Radix | 2M integers |
| Water-NSquared | 512 molecules |
| SPEC OpenMP | |
| Equake-Omp | MinneSpec-Large |
| NAS OpenMP | |
| MG | Class A |
| PARSEC | |
| Blackscholes | 4,096 options |
| Swaptions | 64 swaptions, 10,000 simulations |

Table 3: Simulated applications and data sets.

FIG. 13

| | Area |
|---|---|
| Processor (including on-chip L1 cache) | 0.9 cm² |
| Off-chip L2 cache | 1.13 cm² × 5 chips |
| Main memory | 86.4 mm² |

Table 4: Area of the proposed architecture.

ive output data terminal. When the FIFO receives a flush signal,
the NDRO register is set to 1, and a 1 is inserted at a tail of
the FIFO, and as an invalid data progresses through the
FIFO, the data is set to zero at the FIFO output data terminal,# SUPERCONDUCTING SYSTEM ARCHITECTURE FOR HIGH-PERFORMANCE ENERGY-EFFICIENT CRYOGENIC COMPUTING

CROSS-REFERENCE TO RELATED APPLICATIONS

This application is a national stage application under 35 U.S.C. § 371 of PCT Application No. PCT/US16/61292, filed Nov. 10, 2016, SUPERCONDUCTING SYSTEM ARCHITECTURE FOR HIGH-PERFORMANCE ENERGY-EFFICIENT CRYOGENIC COMPUTING, and published as WO/2018/009240, which claims priority to and the benefit of U.S. provisional patent application Ser. No. 62/254,546, SUPERCONDUCTING SYSTEM ARCHITECTURE FOR HIGH-PERFORMANCE ENERGY-EFFICIENT CRYOGENIC COMPUTING, filed Nov. 12, 2015, which applications are incorporated herein by reference in their entirety.

STATEMENT REGARDING FEDERALLY FUNDED RESEARCH OR DEVELOPMENT

This invention was made with Government Support under Contract Nos. CCF1054179 and CCF1329374 awarded by the National Science Foundation. The Government has certain rights in the invention.

FIELD OF THE APPLICATION

The application relates to superconducting systems architecture for high-performance energy-efficient cryogenic computing, and particularly to rapid single flux quantum (RSFQ) and energy efficient rapid single flux quantum (ERSFQ) based components thereof.

BACKGROUND

In the background, other than the bolded paragraph numbers, non-bolded square brackets ("[ ]") refer to the citations listed hereinbelow.

Data centers and high performance computing have relied on Moore's law scaling to achieve petaflop scale compute capability within feasible power budgets. However, semiconductor scaling, abated by increasingly stringent power constraints, growing manufacturing variability, and ultimately restricted by fundamental physical limits, is predicted to end soon [8, 48, 54]. Moreover, modern data center power consumption is predicted to increase by a factor of three to 661 TWh within the same time frame [6].

Niobium (Nb) based superconductor electronics, an existing and mature technology, enables fundamentally different tradeoffs in performance and power. Conventional superconductor electronics, however, have been limited to small applications such as high frequency analog to digital conversion [28, 33, 37], low latency network switches [17, 23, 60, 63, 64], and embedded space applications [35, 42, 68]. Small scale digital electronics have been demonstrated, but with limited applicability to general computer applications.

SUMMARY

According to one aspect, an energy efficient rapid single flux quantum (ERSFQ) logic register wheel includes a circular shift register having a plurality of destructive read out (DRO) cells. Each entry of the circular shift register includes a data block, a tag, and a valid bit which advance by one entry every cycle of the register wheel. A compare and control logic is coupled to the circular shift register to compare a source specifier or a destination register specifier against a register tag stored in the wheel following each cycle of the register wheel. At least one or more read ports and at least one or more write ports are coupled to the circular shift register to write to or to read from a different entry each in the register wheel following each cycle of the register wheel. The logic wheel includes a Josephson junction (JJ) based ERSFQ logic disposed in a cryostat which maintains cryogenic temperatures.

In one embodiment, the ERSFQ logic wheel progresses through the circular register at a frequency of more than twice a core clock frequency of an associated processor to reduce average access latency.

In another embodiment, the ERSFQ logic register wheel further includes at least one or more additional read port including a single JJ junction.

In yet another embodiment, the ERSFQ logic register wheel further includes at least one or more additional write port including three JJ junctions.

In yet another embodiment, the ERSFQ logic register wheel implements a random access memory (RAM) or a content addressed memory (CAM).

In yet another embodiment, the ERSFQ logic register wheel implements a ERSFQ logic store wheel wherein each entry of the circular shift register further includes an additional bit flag and the ERSFQ logic register wheel further includes at least one or more search ports.

In yet another embodiment, the ERSFQ logic store wheel implements an ERSFQ logic miss store holding register (MSHR) wheel.

In yet another embodiment, the MSHR wheel includes a CAM wheel with an address field for comparison and two fields for secondary misses.

In yet another embodiment, at least one or more of the ERSFQ logic register wheels provide a register file access component of a processor which is coupled to a decode component by asynchronous FIFOs and where the register file access component provides instructions to an execution component via asynchronous FIFOs such that each of the decode component, the register file access component, and the execution component can run at different clock rates.

In yet another embodiment, the ERSFQ logic register wheel further includes a multiported store queue as a write buffer.

In yet another embodiment, at least one or more ERSFQ logic register wheels provide a load queue to support recovery from branch mispredictions.

In yet another embodiment, a first load wheel holds load instructions that have not yet been issued to a memory or searched by a store wheel and a second wheel holds loads after they are issued to a memory subsystem until they are committed.

According to another aspect, a rapid single flux quantum (RSFQ) clearable FIFO with flushing includes a data FIFO including a plurality of data entries. A flush bit FIFO includes a flush bit corresponding to each data entry. A flush signal input terminal is coupled to a nondestructive read out (NDRO) register. A Muller C-gate is coupled to and enabled by an inverted output of the NDRO register, and a FIFO output data terminal. When the FIFO receives a flush signal, the NDRO register is set to 1, and a 1 is inserted at a tail of the FIFO, and as an invalid data progresses through the FIFO, the data is set to zero at the FIFO output data terminal, and when the flush bit reaches a head of the FIFO, a stored 1 resets the NDRO register causing the RSFQ FIFO to return to a normal operation.

In one embodiment, at least one or more of the RSFQ clearable FIFOs connect pipelined stages of a processor core operating at different clock rates.

In another embodiment, the pipelined stages are selected from the group consisting of fetch, decode, register read, execute, memory, and write back.

In yet another embodiment, the core includes a globally asynchronous locally synchronous (GALS) operation having clock distribution and synchronization to provide locally controlling clock signals and to optimize delays across branching logic paths.

According to yet another aspect, a crosspoint memory topology for integrating MRAM devices with ERSFQ circuits includes an array of magnetic tunnel junction (MTJ) devices disposed in a crosspoint array structure, each row oriented in an opposite direction to cancel off-state currents. A row write line is disposed on a first side of each MTJ device. A column line write is disposed on a second side of each MTJ device. A column read line is disposed adjacent to the row write line. To read a device state, a pulse is applied to the device while the rest of the array is biased low. To write the device state, a current will pass through both of the row line and the column line to switch the device.

In one embodiment, the MTJ devices are configured as T Flip-Flop Josephson junction (JJ) circuits.

In another embodiment, a forward circulating current adjusts an effective magnitude of the current passing through the line and individual MTJ devices are selected within the array by a ratio of high and low circulating currents.

In yet another embodiment, during a read, the pulse is applied by a SFQ-to-DC converter.

The foregoing and other aspects, features, and advantages of the application will become more apparent from the following description and from the claims.

BRIEF DESCRIPTION OF THE DRAWINGS

The features of the application can be better understood with reference to the drawings described below, and the claims. The drawings are not necessarily to scale, emphasis instead generally being placed upon illustrating the principles described herein. In the drawings, like numerals are used to indicate like parts throughout the various views.

FIG. 11 shows a table 1 of exemplary architecture parameters;

FIG. 12 shows a table 2 of exemplary architecture parameters of a baseline core and shared memory subsystem;

FIG. 13 shows a table 3 of simulated applications and datasets;

DETAILED DESCRIPTION

Figure 1C:
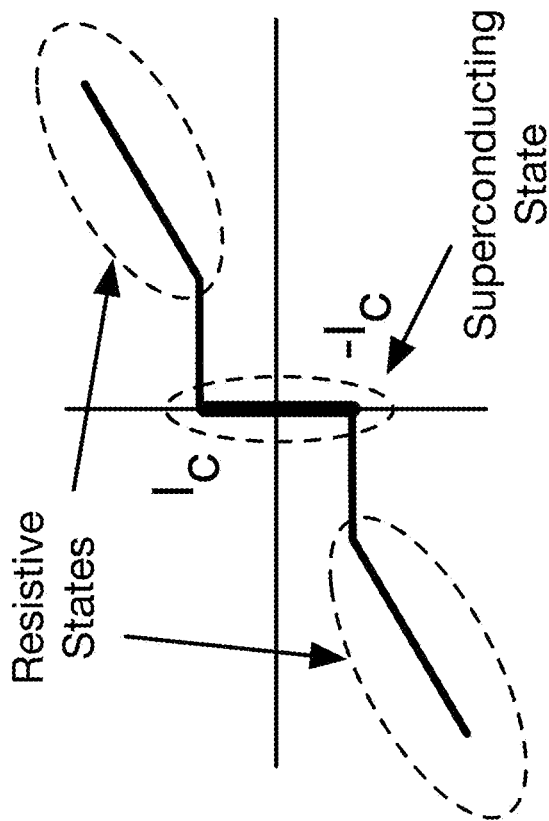
FIG. 1C is a graph that shows the I-V curve of a JJ.

In the description, other than the bolded paragraph numbers, non-bolded square brackets ("[ ]") refer to the citations listed hereinbelow.

1 Introduction

As described hereinabove, data centers and high performance computing have relied on Moore's law scaling to achieve petaflop scale compute capability within feasible power budgets. However, semiconductor scaling, abated by increasingly stringent power constraints, growing manufacturing variability, and ultimately restricted by fundamental physical limits, is predicted to end soon [8, 48, 54]. Moreover, modern data center power consumption is predicted to increase by a factor of three to 661 TWh within the same time frame [6].

Niobium (Nb) based superconductor electronics, an existing and mature technology, enables fundamentally different tradeoffs in performance and power. This class of electronics, based on superconductivity, enables ultra high frequency operation at voltage levels on the order of hundreds of microvolts, three orders of magnitude smaller than standard CMOS, resulting in microprocessors that can consume milliwatts of power with comparable performance to modern CMOS-based systems.

Typical circuits in single flux quantum (SFQ) circuits operate in excess of 20 GHz, while individual logic gates have been demonstrated that operate in excess of 770 GHz [5, 9]. Cryogenic environments provide a near-zero thermal noise environment and quantized signal output, yielding reliable circuits at very small voltage signals. While SFQ circuits require cooling, such as, for example, a large cryocooler, many compute nodes can be placed within a housing to amortize the cost, thereby enabling datacenter scale systems.

Conventional superconductor electronics, however, have been limited to small applications such as high frequency analog to digital conversion [28, 33, 37], low latency network switches [17, 23, 60, 63, 64], and embedded space applications [35, 42, 68]. Small scale digital electronics have been demonstrated, but with limited applicability to general computer applications.

This application describes a new microprocessor and memory system architecture based on energy efficient rapid single flux quantum (ERSFQ) technology. Unlike traditional CMOS which uses static voltage levels to represent logic states, ERSFQ signaling is based on propagating voltage pulses. Most ERSFQ gates are also self latching. However, ERSFQ lacks a pass gate, which prevents isolation between different circuits on a common line, such as a bus or a decoder tree. These characteristics lead to a different design approach from traditional CMOS logic.

A new wheel structure is described hereinbelow which enables search and multi-porting capabilities. The wheel structure, used to implement the register file, the store queue, and the miss status holding registers (MSHRs), significantly reduces the area overhead required to access and control typical CPU blocks. A memory subsystem that leverages CMOS-based DRAM at cryogenic temperatures is also described. An asymmetric memory bus with a simplified DRAM command scheme is presented to deliver sufficient bandwidth under a constrained power budget. The microprocessor and memory system architecture described hereinbelow produces a 1.2 performance improvement over a conventional CMOS multicore system, while operating under a 30 mW power budget achieves a 4.3 times improvement in overall energy consumption.

2 Superconducting Electronics

A superconductor is a material that exhibits zero DC resistance below a critical temperature. As a result, current circulating a superconducting loop flows indefinitely. Superconducting electronic circuits have found commercial application in numerous areas, including magnetic sensors [21, 25, 46, 55], MRI machines [19, 70-72], high-speed A/D converters [28, 33, 37], and reference voltage generators [20, 50, 51]. Their application to computer systems has been limited.

Figure 1B:
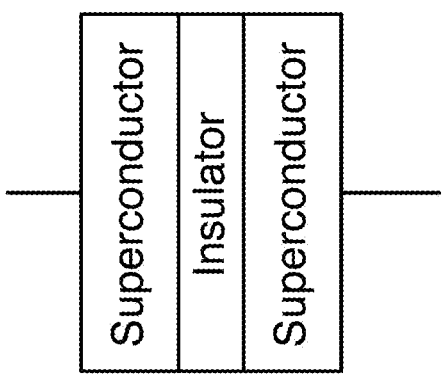
FIG. 1B is a drawing that shows how a JJ is formed from a superconductor-insulator-superconductor (SIS) trilayer called the SIS junction.
Figure 1A:
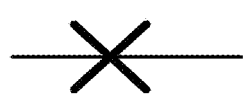
FIG. 1A shows a drawing of the circuit symbol for a Josephson junction (JJ)

FIG. 1A is a drawing that shows the circuit symbol for the switching element used in superconducting electronics, the Josephson junction (JJ). FIG. 1B is a drawing that shows how a JJ is formed from a superconductor-insulator-superconductor (SIS) trilayer called the SIS junction. In large scale superconducting electronics fabrication, Niobium (Nb) or Niobium Nitrate is typically used as the superconductor, and Aluminum Dioxide or Silicon Dioxide is used as the insulator.

FIG. 1C is a graph that shows the I-V curve of a JJ. A JJ has two states: a superconducting state and a resistive state. In the superconducting state, the JJ behaves as a superconductor with zero DC resistance; in the resistive state, the JJ behaves as a resistor with finite resistance. The JJ transitions from the superconducting state to the resistive state when the current through the JJ exceeds a critical current, $I_c$. When the junction is in the superconducting state, the current through the junction can take on any value between $-I_c$ and $I_c$. Every time a JJ switches to the resistive state, a voltage pulse develops across its two terminals. In Rapid Single Flux Quantum (RSFQ) logic, this voltage pulse is used as the physical basis for logic operations.

JJ devices, and thus circuits based on JJ devices, can scale to deep sub-micron technology nodes. Modern JJ technologies exhibit physical feature sizes on the order of 1 μM, a scale significantly less dense (and more mature) than CMOS lithographic techniques can achieve. This implies that much of the technological development used for silicon can be repurposed for Nb processes. Physical scaling facilitates increases in the critical current density, $J_C$, which is a physical parameter that describes the current required switch to a JJ from the superconducting state to the resistive state. This parameter is exponentially dependent on the tunnel barrier thickness.

JJ circuits also depend on large passive components to stabilize their operation. Each JJ must exhibit sufficient resistive damping to prevent unstable oscillatory behavior. These passive components often consume a majority of the circuit area. As $J_C$ increases beyond 100 A/cm2, the intrinsic resistance of the tunnel barrier becomes sufficient to damp the device. Hence, 100 A/cm$^2$ represents an inflection point in the scaling behavior of JJs, beyond which self-shunted JJs enable a significant density advantage over present Nb JJ technologies.

2.1 Superconducting Logic Families

A number of logic families based on RSFQ logic have been proposed. These families aim at improving on RSFQ in a number of ways, typically by reducing static power consumption.

2.1.1 Rapid Single Flux Quantum (RSFQ) Logic

RSFQ logic uses the switching property of JJs to transmit and store the short voltage pulses that are generated when a JJ transitions to the resistive state. RSFQ logic is promising because it provides fast switching (1 ps) and low energy per switching event ($10^{-19}$ J) [26].

Figure 2:
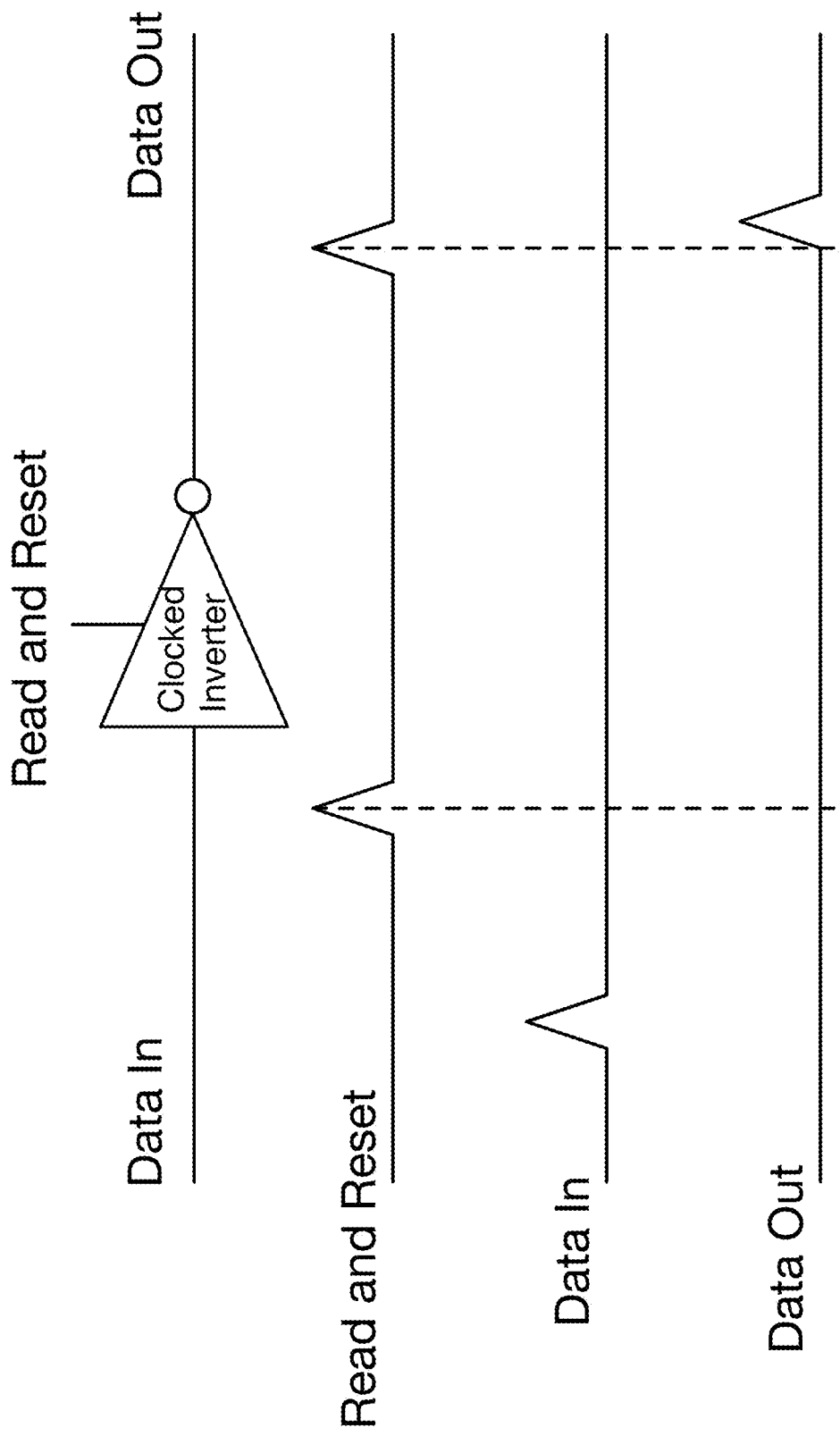
FIG. 2 shows a timing diagram for an exemplary clocked RSFQ inverter.

Unlike CMOS logic gates which represent high and low logic values with different voltage levels, RSFQ logic gates represent logic values by the presence or absence of voltage pulses within a pre-determined timing interval. FIG. 2 shows a timing diagram for an exemplary clocked RSFQ inverter. In addition to the data input and output terminals, the inverter has a read and reset terminal connected to the clock. Before the arrival of the first reset signal, a voltage pulse appears at the input terminal (logic 1). This voltage pulse causes the inverter to store a logic 0, so that no output voltage pulse is generated the next time the read and reset input is pulsed. Conversely, between the first and second reset signals, there is no input pulse (logic 0), and as a result, the second reset causes an output voltage pulse (logic 1). This exemplary clocked RSFQ inverter demonstrates another important property of RSFQ gates: many of the combinational CMOS logic gates are state holding in RSFQ. Conceptually, an RSFQ gate can be considered a conventional combinational logic gate in series with an output latch.

These differences in bit representation and gate design create a number of important distinctions between RSFQ logic and traditional CMOS logic. One important RSFQ gate is a Muller-C gate, or "CFF". A Muller-C gate has three inputs—two data and one reset. If a pulse arrives at both data inputs without an intervening reset signal, then an output pulse is generated. In RSFQ, a Muller-C gate can often serve a purpose similar to a pass gate in CMOS design. Another important RSFQ gate is the destructive read out (DRO) register, which provides a high density (4 JJs per bit) storage but suffers from destructive reads. In contrast, a nondestructive read out (NDRO) register provides an input and output port for non-destructive reads but uses 9 JJs. Note that neither a NDRO nor a DRO register can have a stored 1 overwritten by a 0 without an intervening reset. For fan-in, a special RSFQ gate known as a "merger" is used. A merger serves as an asynchronous OR gate, and can be combined with a DRO or inverter to create synchronous OR and NOR gates, respectively. Fan-out uses a special RSFQ gate known as a splitter, which splits a voltage pulse along two paths, and restores the voltage pulse to full height. For large fan-in or fan-out, a merger or splitter tree is typically used. Most gates that are used in CMOS are also available in RSFQ; however, the cost of these gates is quite different. For example, multiplexers, demultiplexers, XOR gates, and XNOR gates are several times more expensive than a basic DRO.

2.1.2 ERSFQ

Although the dynamic power dissipation of standard RSFQ circuits is low, the total power consumption is dominated by the static power caused by Joule heating in current biasing resistors. This limits the use of standard RSFQ for VLSI circuits [38]. ERSFQ logic is one of the energy-efficient SFQ logic families that can eliminate the static power dissipation by using inductors to generate DC bias currents. ERSFQ employs a combination of additional junctions and inductors that increase the junction count and area by about 40 times over standard RSFQ, and approximately doubles the dynamic power dissipation. However, compared to the standard RSFQ logic, ERSFQ is much more energy efficient because it virtually eliminates static power consumption.

2.2 Magnetic Josephson Junction

A Magnetic Josephson Junction (MJJ) is a Josephson spintronic device with a ferromagnetic layer, which can change and retain the critical current value based on the ferromagnetic layer magnetization. MJJs are compatible with the traditional JJs used for standard RSFQ or ERSFQ logic, and they can be integrated on the same chip with JJs in a single fabrication process [57]. Therefore, a simple hybrid decision-making pair (dc biasing and serially connecting a MJJ with a standard JJ) can be used as a memory cell to build a fast, energy-efficient, nonvolatile and relatively dense cryogenic cache [39, 49, 57]. For a MJJ based memory array, the write operation is performed by sending multiple SFQ pulses, generated by an SFQ-to-DC converter [18, 45], to the desired memory cell. The critical current of the MJJ in the target memory cell is modified such that it is either above or below the critical current of the JJ in the cell. The read operation is performed by sending an SFQ pulse along a wordline. This SFQ pulse triggers either the MJJ (generating a pulse on the bit line) or the standard JJ (generating no pulse) depending on which JJ has a lower critical current. The absence or presence of this pulse is detected to read out a line [39, 49, 57].

Although the capacity and density of MJJ based memory is lower than cryogenic hybrid JJ-CMOS RAM [29, 56], it has the capability to operate with a clock rate and energy consumption similar to ERSFQ circuits. In addition, compared to other native SFQ technologies, MJJs can have a higher density because the storage element is a ferromagnetic layer rather than a large inductor.

2.3 Cryostats

The cryogenic environment is an important difference between RSFQ and CMOS that imposes a number of limitations. For example, in some embodiments, 4 Kelvin cryostats typically use a two stage design with an initial cooling stage that uses liquid nitrogen and a cold-head or cold box that is cooled to 4K. A cryostat has a cooling efficiency, typically reported in watts per watt, which indicates how many watts of power it takes to dissipate one watt within the cryostat. This value varies from several thousand watts per watt to several hundred watts per watt depending on a number of factors, including the size of the cryostat (the larger the better). Cryostats also have a finite cooling capacity, which limits the maximum power that can be dissipated within the cryostat. Interfacing between the cryostat and room temperature allows heat leak into the system within the interface; this heat leak grows with the number and cross-sectional area of the wires.

3 Overview

An energy efficient, superconducting computer system can be designed by partitioning hardware components between cryogenic and room temperature environments based on latency and power considerations. On the one hand, communicating with components outside the cryostat involves traversing wires longer than one meter, which results in long latencies. On the other hand, the cryostat has a limited power budget, and draws multiple hundreds of watts from the power supply for every watt consumed inside the cryostat. The limited cooling capacity of the cryostat makes it impractical to cool high-power devices to cryogenic temperatures. Once the system has been partitioned between cryogenic and room temperature domains, the electrical interface between these different temperature regimes should be architected to minimize the number and size of the wires, as wires allow heat to leak into the cryostat and cut into the cooling and power budgets.

Figure 3:
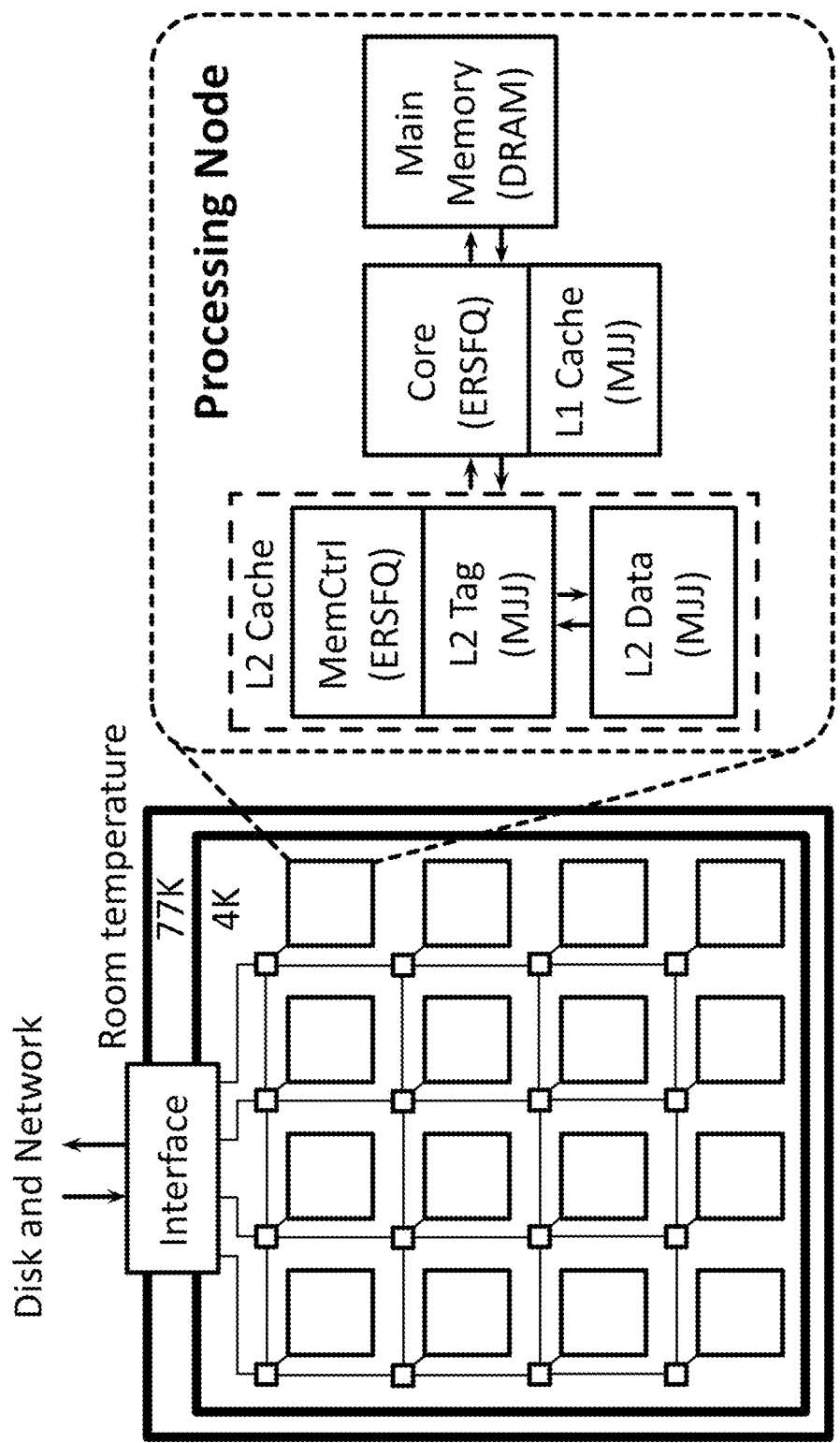
FIG. 3 is block diagram which shows how different components of the proposed system can be partitioned between room temperature and cryogenic environments.

FIG. 3 is block diagram which shows how in one exemplary embodiment different components are partitioned between room temperature and cryogenic environments. Inside the cryostat, a mesh architecture connects processing nodes, each comprising a multithreaded ERSFQ processor, off-chip L2 cache implemented with MJJs, and main memory implemented with 1T-DRAM. External storage, a network interface, and power supplies are located outside the cryostat at room temperature, as the power consumption of these modules far exceeds the power budget of the cryostat. To minimize heat leakage, the cryogenic environment connects to room temperature through an intermediate cooling stage at 77 Kelvin, which uses liquid nitrogen. Only the performance of a single node is considered as described in more detail hereinbelow. RSFQ network routers suitable to enable message passing among multiple nodes have been designed and studied in prior work [41, 65, 66, 69].

4 Processor

Figure 4:
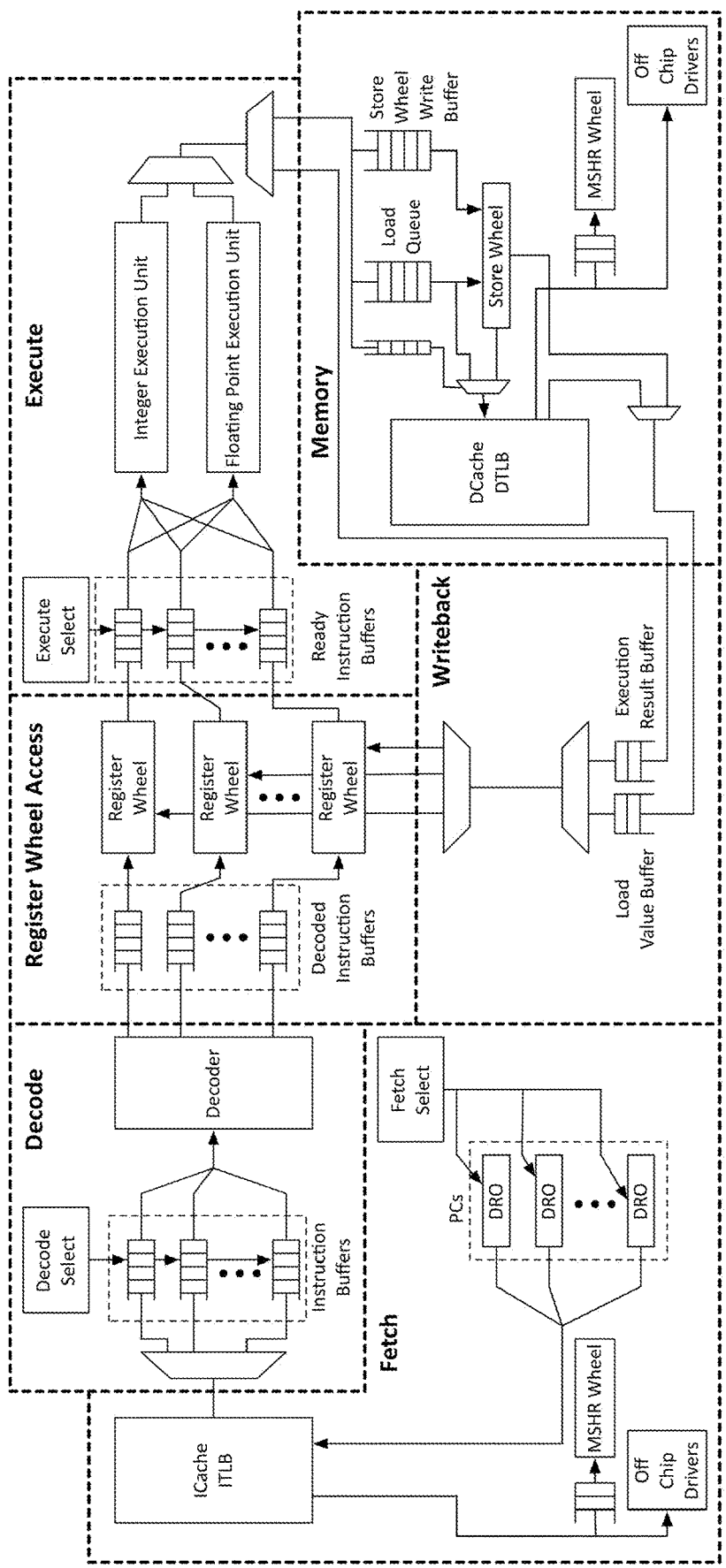
FIG. 4 shows a block diagram of one exemplary embodiment of a processor based on RSFQ logic.

The proposed processor comprises six major pipeline stages: fetch, decode, register file access, execute, memory, and write back. These stages are connected through asynchronous FIFOs [22] to allow different stages to operate at different clock rates. FIG. 4 shows a block diagram of an exemplary embodiment of a processor based on RSFQ logic. This globally asynchronous, locally synchronous (GALS) hardware organization simplifies the clock distribution network, and provides the opportunity to improve performance and energy efficiency. Because RSFQ logic gates can switch fast and hold state, most of the major stages are further partitioned into minor pipeline stages. Thus, the ERSFQ processor is deeply pipelined without incurring the overhead of extra pipeline registers that would be needed in a deeply pipelined CMOS processor. To keep the pipeline busy, the proposed processor uses fine grained multithreading with sixteen thread contexts.

4.1 Front-End

In one exemplary embodiment, the fetch unit includes a thread selector, a PC for each thread context, and an adder to compute the next PC, and control logic. Because of the low JJ density at the current RSFQ technology node, the thread selection logic implements a simple, pseudo-round-robin policy that minimizes JJ count. This reduction in JJ count is achieved by using gates that are simple to implement in RSFQ, such as a destructive readout register and a merger, instead of complex gates such as multiplexers or XNOR gates.

Figure 5:
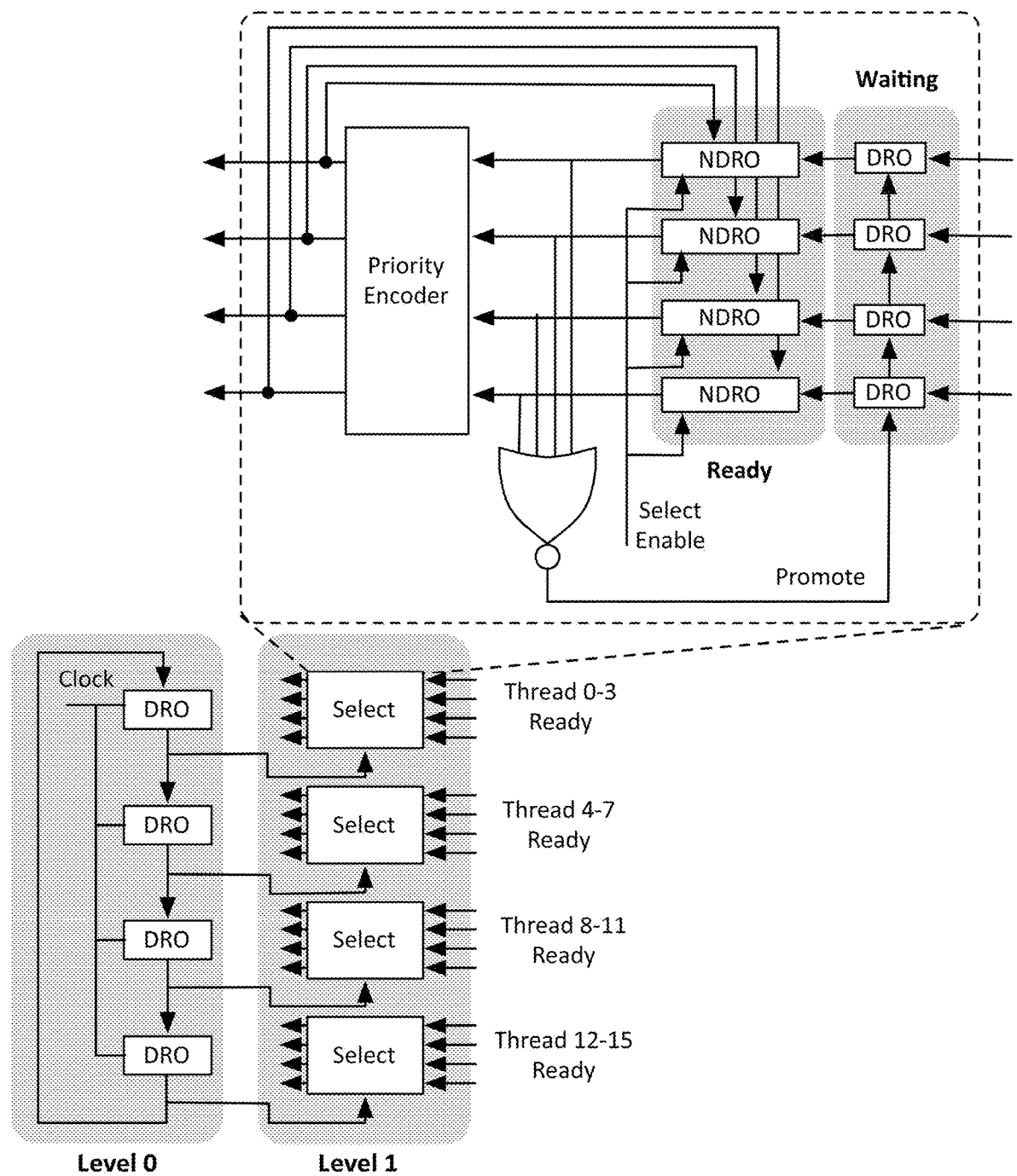
FIG. 5 shows a schematic diagram of an exemplary pseudo round-robin scheme which implements a two-level selection mechanism.

FIG. 5 shows a schematic diagram of an exemplary pseudo round-robin scheme which implements a two-level selection mechanism. In the first level, it divides the sixteen threads into four groups, and uses a four-bit shifter to select one of the groups in round-robin order. Within the selected group, one of the ready threads (i.e., the threads that are not stalled due to a full instruction buffer or an instruction cache miss) is selected using a priority encoder. To avoid starvation, two bit-vectors are used within each group: (1) a ready bit-vector, which records the request signals to the priority encoder and resets the entry for a ready thread to zero as soon as that thread is scheduled; and (2) a waiting bit-vector, which records newly available threads that become ready while the scheduler works on the threads in the ready bit-vector. Once all of the threads whose bits are set in the ready bit-vector are scheduled, the waiting bit-vector is copied to the ready bit-vector, and is reset to zeroes. Although it is possible for the selected group to have no threads that are ready to fetch, this situation is rare in practice, and the pseudo round-robin scheme provides performance comparable to a true round robin policy with much lower hardware cost. Because the processor is deeply pipelined and a branch instruction takes multiple clock cycles to resolve, the fetch engine uses a simple static branch prediction scheme (always not taken). Every clock cycle, the PC of the selected thread is sent to the instruction cache.

Because content addressable memory (CAM) is expensive in the RSFQ logic family, the buffers that connect the decode stage to the fetch and register wheel access stages are implemented with a FIFO structure that supports flushes to efficiently recover from branch mispredictions.

Figure 6A:
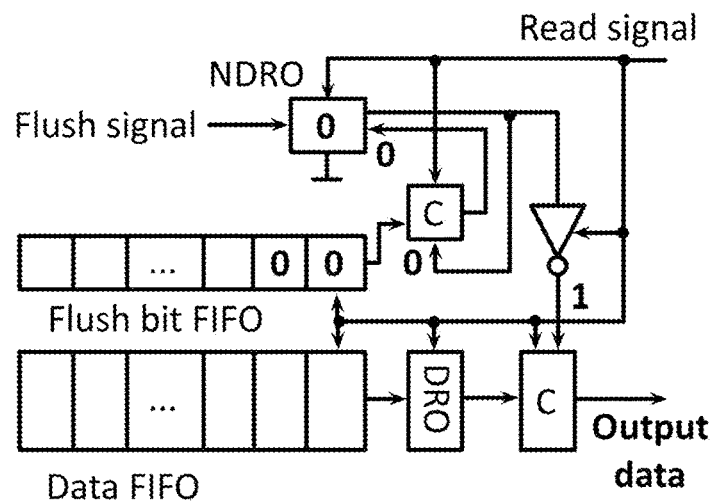
FIG. 6A is a schematic diagram showing a normal operation of an exemplary RSFQ FIFO that can support a flushing scheme.

FIG. 6A is a schematic diagram showing a normal operation of an exemplary RSFQ FIFO that can support a flushing scheme. This FIFO structure includes multiple data entries, and a flush bit per entry. These flush bits, as well as the nondestructive read out (NDRO) register, are initialized to 0. When the next stage tries to read data from the FIFO, the Muller-C gate is enabled by the inverted NDRO output, which allows valid data to pass through the Muller-C gate and reach the next stage.

Figure 6B:
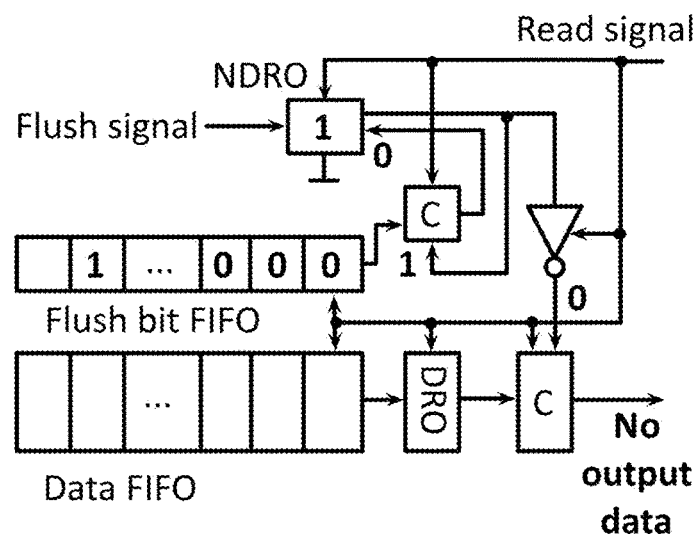
FIG. 6B shows a flush contents operation of the RSFQ FIFO of FIG. 6A.

FIG. 6B shows a flush contents operation of the RSFQ FIFO of FIG. 6A. If the FIFO receives a flush signal, the state of the NDRO register is set to 1, and a 1 is inserted at the tail of the FIFO. As a result, the inverted NDRO output becomes 0, which prevents the data from passing through the Muller-C gate. As the invalid data progresses through the FIFO, the data is set to zero on readout by the Muller-C gate.

Figure 6C:
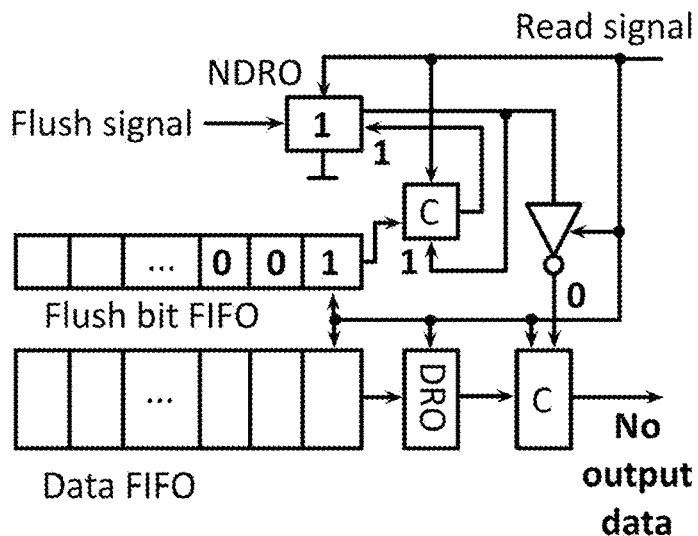
FIG. 6C shows a clear flushing signal operation of the RSFQ FIFO of FIG. 6A.

FIG. 6C shows a clear flushing signal operation of the RSFQ FIFO of FIG. 6A. When the flush bit reaches the head of the FIFO, the stored 1 resets the NDRO flush flag and the system returns to normal operation as shown in FIG. 6C.

The proposed pseudo round-robin selection logic can also be used in the instruction decoder to select an instruction to be decoded from one of the sixteen instruction buffers. The decoder uses a combination of shifters and Muller-C gates (instead of expensive multiplexers) to steer the decoded instruction to the buffer for the corresponding thread. In one exemplary embodiment, the decoder is divided into four minor stages, and is designed to maintain a high clock frequency. The jump address is computed in parallel with the decoding, and is sent to the fetch engine at the end of the decode stage.

4.2 Register File Access

Figure 7:
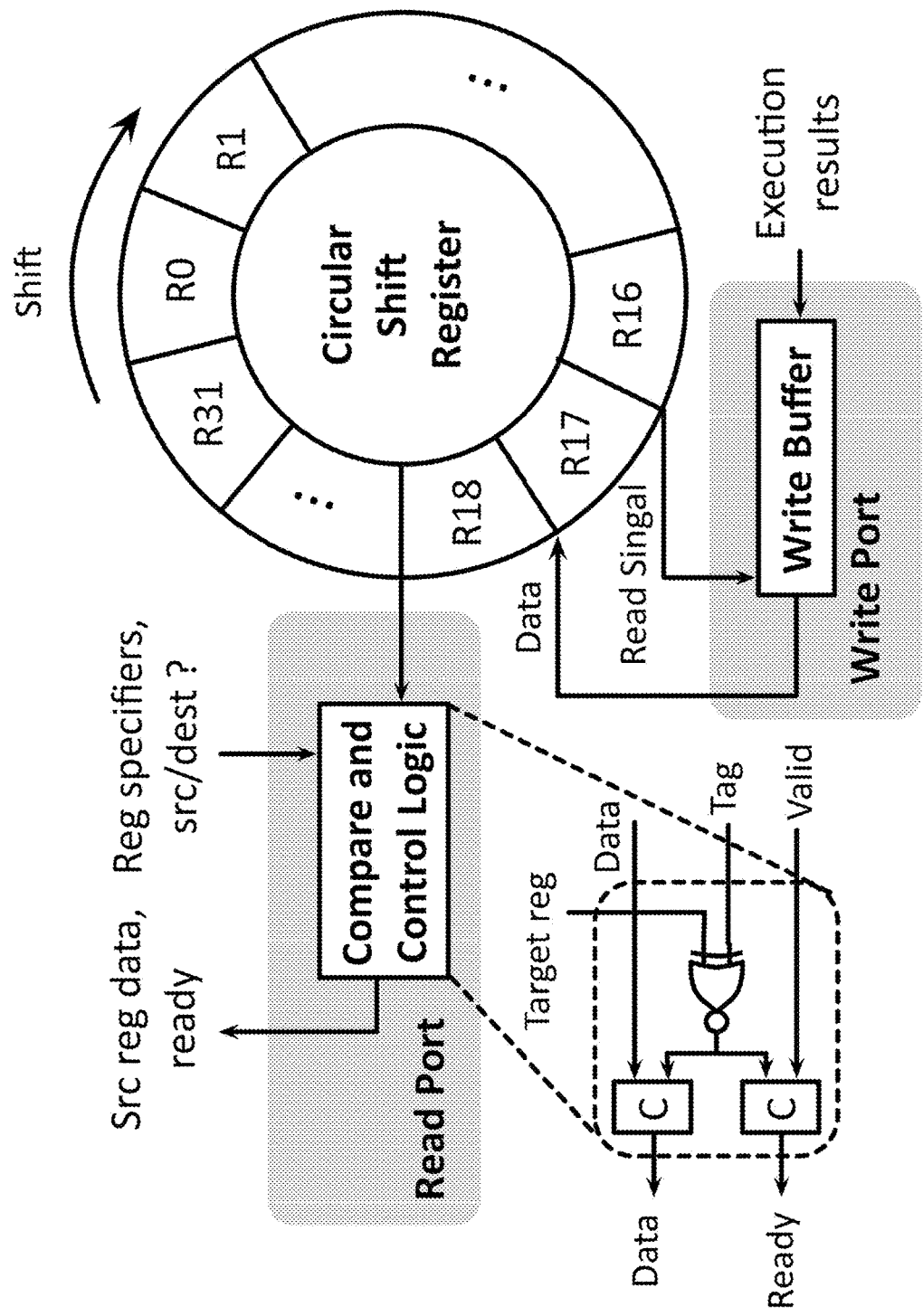
FIG. 7 shows a schematic diagram of an exemplary register wheel.
Figure 8:
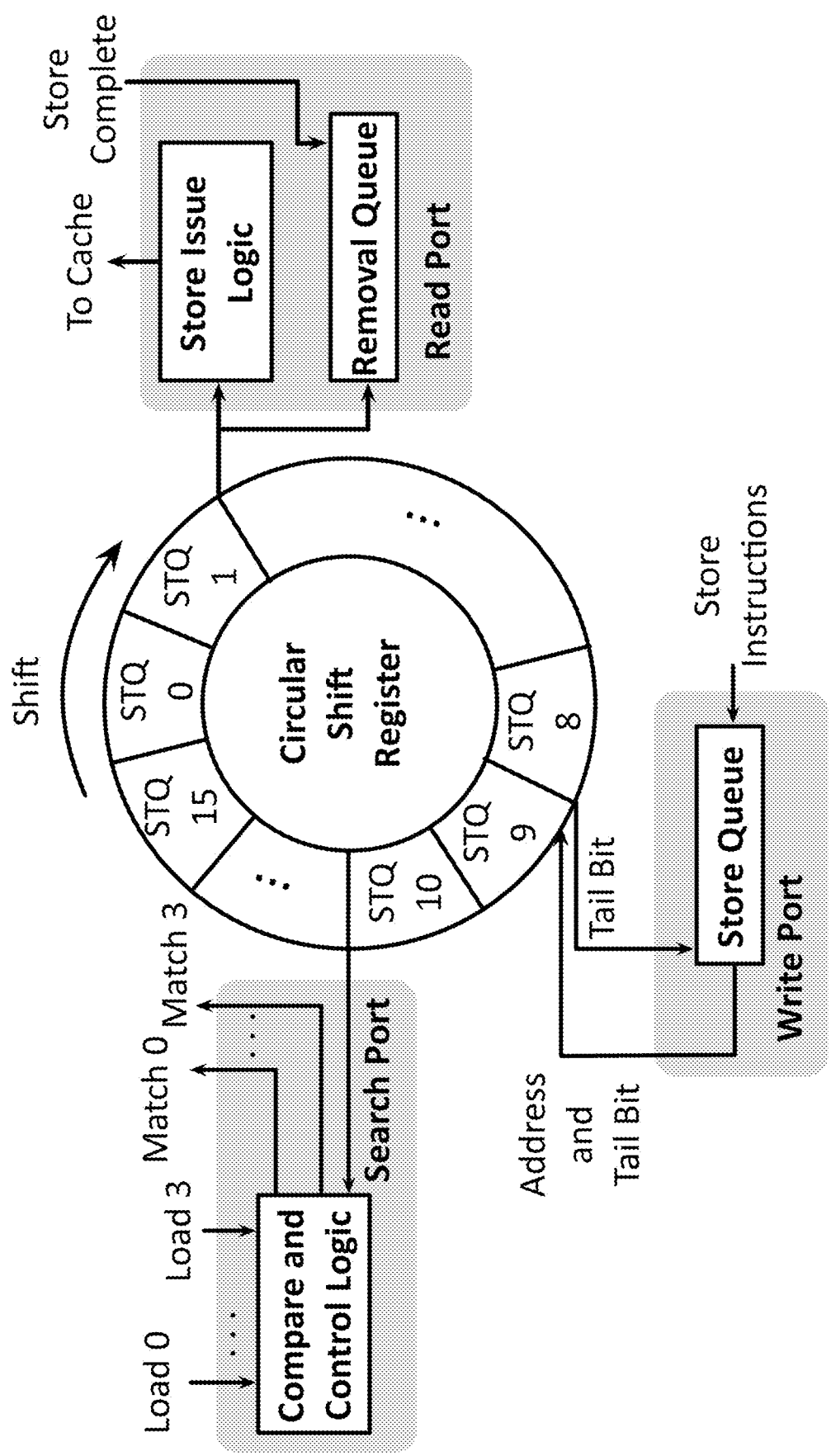
FIG. 8 shows a schematic diagram of an exemplary store wheel.

Conventional register files are inefficient to implement in RSFQ due to the large number of JJs necessary to implement each register with non-destructive readout. FIG. 7 shows a schematic diagram of a new hardware structure called a "register wheel" which solves this problem. The proposed register wheel implements a circular buffer using efficient DRO registers. Each entry of the register wheel stores one architectural register and a valid bit. Every register wheel cycle, the register wheel conceptually rotates by one entry, and a different register becomes accessible through its read port. Thus, the contents of any register can be observed by waiting in the register wheel access stage until the register appears at the read port, as conceptually shown in FIG. 7.

When an instruction arrives at the register wheel access stage, the source and destination register specifiers are sent to a compare and control logic. Because the architectural registers rotate constantly, the compare and control logic can compare the source and destination register specifiers against a new register tag stored in the wheel every cycle. If the current register is valid and its tag matches one of the source register specifiers, the register value is latched and sent to the next stage for execution. At the end of this clock period, the wheel rotates by one element and the next stored register becomes accessible via the read port. However, if the stored register tag matches the destination register specifier, before moving to the next shifter in the circle, the tag, the value, and the valid bit should all be reset to guarantee correct operation for the writeback stage. (Resetting the tag and value fields is done because a DRO register does not allow overwriting a 1 with a 0; instead, it provides a global reset functionality for all of the bits in the register.)

As the register wheel is built on top of the simple and fast DRO gate, it can rotate at a frequency that is several times higher than the core clock frequency of the processor, which is four times faster in the proposed design. This higher clock rate reduces the worst case register file access latency by a factor of four.

4.3 Execute

After accessing the register wheel, the instruction is sent to a ready instruction buffer shared by a group of threads, and is selected for execution using the pseudo round-robin scheme described hereinabove in Section 4.1. Both the ALU and the FPU are deeply pipelined to maintain a high clock frequency. The integer ALU and multiplier are designed based on existing work [1, 12, 15]. An RSFQ barrel shifter is implemented to handle the shift instructions, and completes execution in four cycles using a small number of JJs.

Since most of the existing RSFQ floating point adders and multipliers are bit-serial, a new, 32-bit deeply pipelined RSFQ floating point adder and multiplier are designed.

The branch condition is resolved in the execute stage; if the condition indicates a taken branch, the branch address and the branch signal are sent to the front-end for fetching. The branch signal is also sent to the decode and register wheel stages for recovery. After execution, the result is stored in the load/store queue as an effective address if the instruction is a load or a store; otherwise, it is placed in an ALU result buffer with its register tag and thread ID, where it awaits writeback.

4.4 Memory Access

After effective address computation, loads and stores are respectively placed in FIFO load and store queues. In addition, a single bit flag indicating if the operation is a load or a store is written to a shared bookkeeping queue to preserve ordering. A store instruction blocks this queue until it can be written to the store wheel. To preserve in order writeback and to avoid coherence issues, only one load and one store from each thread can be in flight simultaneously. The store queue and the MSHRs present a challenge for RSFQ logic due to the lack of an efficient CAM circuit. In some embodiments, a CAM wheel structure similar to the register wheel described in Section 4.2 is used to implement the store queue (i.e. the store wheel) and the MSHRs. One important difference between the store wheel and register wheels (previously discussed) is the need for ordering information in the store queue. A store cannot be written into an arbitrary entry on the wheel, instead head and tail bits should be stored in every wheel entry to track the location of the store queue head and tail. An additional bit flag is stored in the wheel to track whether the corresponding store instruction has issued to memory. After this bit passes the read port of the store wheel, the oldest store in the queue that has not been sent to memory is issued. If the store hits in the cache, it is removed from the wheel; if it misses in the cache, it is allocated an MSHR entry.

When a load instruction reaches the head of the load queue, the load speculatively accesses the cache and begins searching the store wheel, which in some embodiments, can take from one to four cycles depending on the current state of the wheel. To prevent the load queue search from becoming a performance bottleneck, the store wheel has multiple search ports. A search operation can start at any point on the store wheel and looks for the head or tail bits. If the head bit is found first, all of the matches found between the beginning of the search and the tail bit must have been seen from the oldest to the youngest. Hence, if the tail bit is found first, any matches found so far are known to be younger than any other matches to be found in the queue. If a match is found in the wheel, the corresponding value is forwarded to the load. If no matches are found in the cache or in the store wheel, the load is placed in an MSHR buffer to be written into the MSHR wheel.

The MSHR wheel is a CAM wheel with an address field for comparison and two fields for secondary misses. Returning memory accesses search the MSHR wheel and add the instructions in the matching wheel entry back into the load or store queues to be replayed.

4.5 Writeback

Each clock cycle, a register value and its identifier are read from either an execution result buffer or a load value buffer in round-robin fashion. The register value is sent to the write buffer inside the register wheel along with the thread ID.

As shown in FIG. 7, the write buffer is a FIFO, each entry of which stores the write back register value with its register tag. Every time a register in the wheel passes through the write port, its valid bit is inverted, and acts as the read signal of the write buffer. If the write buffer is not empty, both the value and the tag will enter the register wheel for future accesses. The write port can be placed next to the read port to reduce the latency between data dependent instructions.

5 Memory Subsystem

To achieve a sufficiently large and fast memory subsystem, the architecture described herein can use two different memory technologies. MJJs can be used for caches; as a native RSFQ technology, where MJJs can be interfaced readily with ERSFQ circuits. The main memory can be implemented, for example, using 1T-DRAM to achieve high capacity.

5.1 On-Chip L1 Caches and TLBs

The L1 instruction cache, the L1 data cache, and the TLBs can be implemented using magnetic Josephson junctions (MJJs), which are high-speed storage devices native to ERSFQ technology. The relatively low density of MJJs places substantial limits on the size of the L1 caches. The L1 data cache is shared among all of the threads to avoid the need for a coherence protocol. MJJs, similar to other MRAM technologies, suffer from long write latencies. To prevent writes from frequently blocking reads, in some embodiments, the cache is heavily banked. MJJ arrays use a well known SFQ-to-DC converter to convert an SFQ pulse into a pseudo-DC signal comprising multiple SFQ pulses spaced closely in time. In some embodiments, these SFQ-to-DC converters are used to implement the line and column drivers for the MJJ arrays. For tag comparisons, XNOR gate based comparators can be used instead of a CAM wheel, since (1) a tag comparison is a one time comparison, which allows destructive readout (rather than non-destructive readout) cells to be used, and (2) for tag comparison, the values cannot easily be loaded into a wheel in advance, since they must first be read from the array. Using XNOR gates limits the associativity of the L1 caches and the TLBs because of the relative inefficiency of XNOR gates compared to wheel based structures.

5.2 Off-Chip L2 Cache

Density and integration scale limitations can prevent the L2 cache from being placed on chip. Therefore, in some embodiments, the L2 cache is split between five separate ICs within a multi-chip module (MCM), one containing the tag array and the control logic, and four containing 1 MB data arrays. Since the L2 is off chip, the strict JJ budget imposed on the L1 caches do not apply, which allows for greater associativity using XNOR based tag comparison. The L2 MSHRs are still implemented using a CAM wheel structure. To maximize the available bandwidth for the L2 cache, each L2 cache IC has a direct bus to the processor.

5.3 Main Memory

Figure 9:
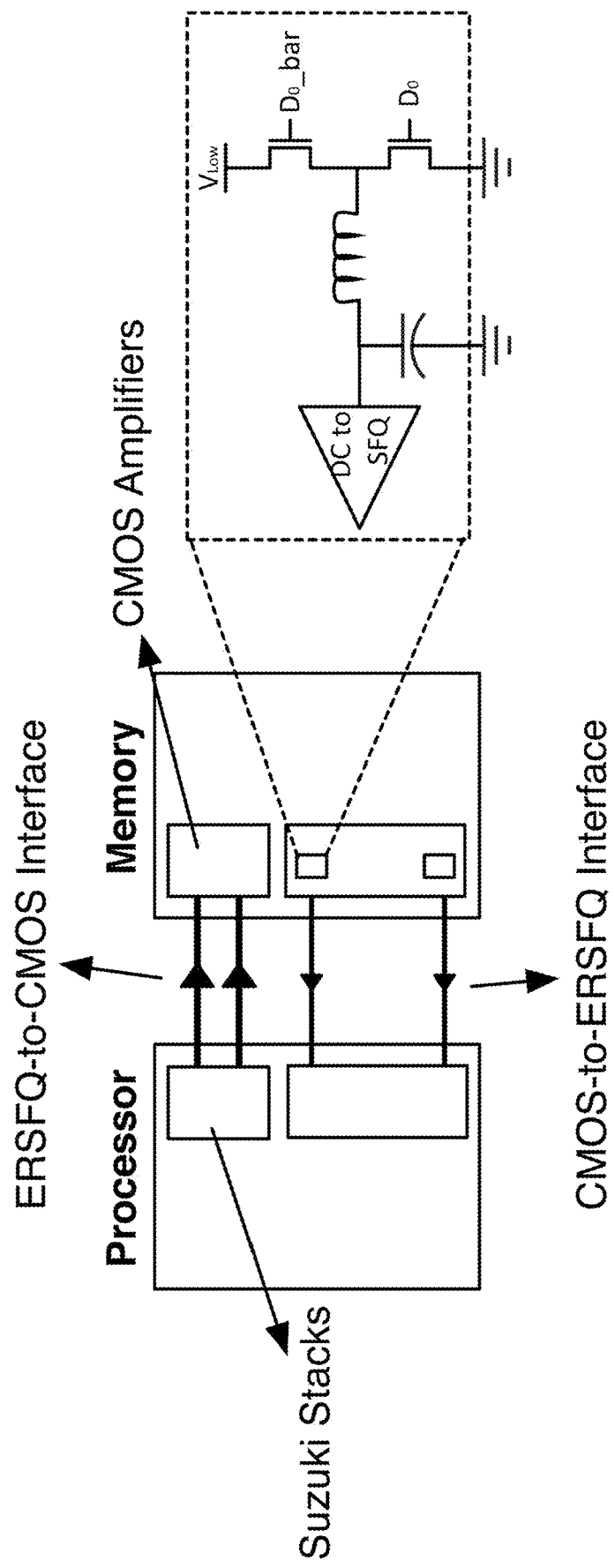
FIG. 9 shows a schematic diagram of one exemplary circuit suitable for interfacing RSFQ voltage pulses and CMOS voltage levels.

High density main memory poses a significant challenge to ERSFQ systems. While MJJs provide sufficient density for caches, at present, the density of MJJs and other native RSFQ memories is not sufficient for main memory. Previous efforts have operated SRAM and DRAM at cryogenic temperatures to implement large scale RSFQ memories [29, 56]. In some exemplary embodiments, main memory is implemented with 1T-DRAM. In a cryogenic environment, 1T-DRAM gains a number of performance advantages over room temperature, mainly due to reduced line resistances and a high retention time that makes refresh operations unnecessary. Interfacing between SFQ voltage pulses and CMOS voltage levels consumes a substantial amount of power. In some embodiments, to achieve sufficient amplification, a two-stage scheme can be employed (FIG. 9). A Suzuki Stack (SS) [44, 53], which is a well known latching JJ based amplifier, can be used on the ERSFQ processor, and communicates to a second stage CMOS amplifier on the memory chip. The power consumption of this interface is proportional to the number of parallel wires. To limit this power, a 34-bit bus carries the required information from the processor to memory. The bus is used for both read and write operations. On a write operation, the address (32 bits) and control signals (2 bits) are placed on the interface first. Next, the data block (512 bits) starts bursting on the 32 wires of the interface. As a result, a memory write operation requires 17 cycles to complete.

Similar to the write operation, a read operation transfers the address and control signals through the ERSFQ-to-CMOS interface. The data block, however, is transferred on a dedicated read bus, which relies on CMOS-to-ERSFQ interfacing techniques. As shown in FIG. 9, interfacing CMOS with ERSFQ for reads can be accomplished by voltage matching with the ERSFQ circuits. In some embodiments, an NMOS-based interface is employed to drive off-chip connections to the ERSFQ microprocessor. The interface uses a reduced supply voltage ($Vdd_{low}$) to drive the interconnect line. A signaled data bit forms a resistive divider with the ERSFQ circuit to generate a low DC level on the output line. A DC-to-SFQ converter transforms this DC level into an SFQ pulse on the microprocessor. The interface from memory back to ERSFQ consumes substantially lower power than the interface from the processor to memory, allowing for a wide bus to be used to increase read bandwidth.

Figure 10:
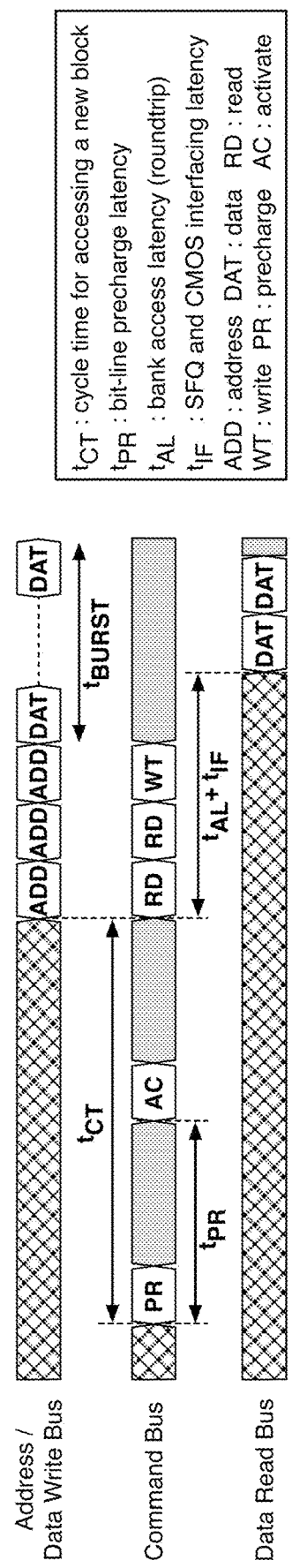
FIG. 10 shows an exemplary DRAM timing diagram.

The asymmetric latency and bandwidth characteristics of the memory bus uses a DRAM command protocol optimized for the proposed computer system. An exemplary timing diagram for this command protocol is shown in FIG. 10. Note that the address and data write signals are transferred using the same interfacing wires in hardware. Because the command protocol is custom designed, it provides only the functionality required for the proposed computer system. On a read, an address is sent along the shared address and data buses, and after $t_{AL}+t_{IF}$ cycles, it is returned along the wide read bus in a single cycle. On a write, the address is first sent on the shared address and data buses, followed by a burst of data, one byte per cycle.

FIG. 10 shows the timing constraints used for three memory requests (two reads followed by a write to the same DRAM row). The first read access opens a new row, which uses precharge (PR) and activate (AC) operations and for a multi-cycle latency ($t_{CT}$) between the precharge and read (RD) operations. The row activation starts after the precharge completes ($t_{PR}$). For each read operation, both address and command bits are transferred to the memory in one cycle. Because the read operations are to the same DRAM row and the data read bus is sufficiently wide, the reads can be issued back to back. After $t_{AL}+t_{IF}$ cycles, the corresponding data blocks return from main memory in the same order the read commands were sent. After the reads, the memory controller issues the address and command bits for the write operation.

6 Experimental Setup (Example)

To evaluate the performance, energy, and area of the proposed architecture, both circuit and architecture level simulations were conducted. The tools, parameters, applications, and assumptions made in the evaluation are described in this section.

6.1 Circuits and RTL Design

To simulate CMOS at cryogenic temperatures, the 22 nm PTM model of a transistor was modified [67]. Key transistor performance parameters, such as the threshold voltage and mobility, were scaled from the transistor modeling data presented in [30]. Notably, operating at cryogenic temperatures results in a large transistor threshold that is comparable to the supply voltage of the technology. A forward body bias was applied to model a CMOS technology that has been optimized for cryogenic operation wherein the threshold and supply voltages have both been reduced. Circuit simulation was used to generate transistor performance parameters for the peripheral circuitry and cell transistors used in CACTI 6.5 [40]. Parasitic interconnect resistances were reduced in a cryogenic environment because bulk copper resistivity falls by approximately a factor of two thousand [32]. Off-chip parasitics were modeled with an effective length of 1.5 centimeters, which is typical for System-In-Package interconnects. The parasitics were approximated by standard wire bond impedances available for MOSIS fabrication[36]. For power and delay estimation, a Verilog model of the processor was constructed and simulated using the Verilator toolkit [52]. Each pipeline stage was modeled individually to determine the critical path delay, and the activity factor per instruction. The critical path delay, the JJ count, and the area of the design were estimated using the Hypress and Bakolo[3] standard cell libraries scaled to a 10 kA/cm2 fabrication process.

6.2 Architecture

The SESC [47] simulator was modified to model both the proposed architecture (parameters are shown in Table 1 of FIG. 11) and a Niagara-like in-order CMT baseline. Table 2 of FIG. 12 lists the architecture parameters of the baseline core and the shared memory subsystem. The energy and the area of the baseline processor were evaluated using McPAT [31].

To evaluate the energy of the proposed ERSFQ processor, the dynamic energy of a conventional RSFQ implementation of the processor is derived based on the JJ counts and the switching activity factor obtained from RTL simulation. Then, the ERSFQ energy is obtained according to the dynamic energy scaling factor from standard RSFQ to ERSFQ (the static power is zero for an ERSFQ circuit) [38]. The energy consumption of the cryostat is calculated based on the power consumption of commercially available cryostats [27]. A modified version of CACTI 6.5 [58] is used to derive latency, access energy, static power, and area for main memory at cryogenic temperatures, based on parameters obtained from circuit simulation.

6.3 Applications

The evaluated benchmarks represent a wide range of parallel applications from Data mining [24], Phoenix [62], SPLASH-2 [59], SPEC OpenMP [10], NAS [2], and PARSEC [4] suites. FIG. 13 shows table 3 which lists these applications and their input sets.

7 Evaluation

This section evaluates the performance, energy, and area characteristics of the new architectures described herein.

7.1 Performance

Figure 14:
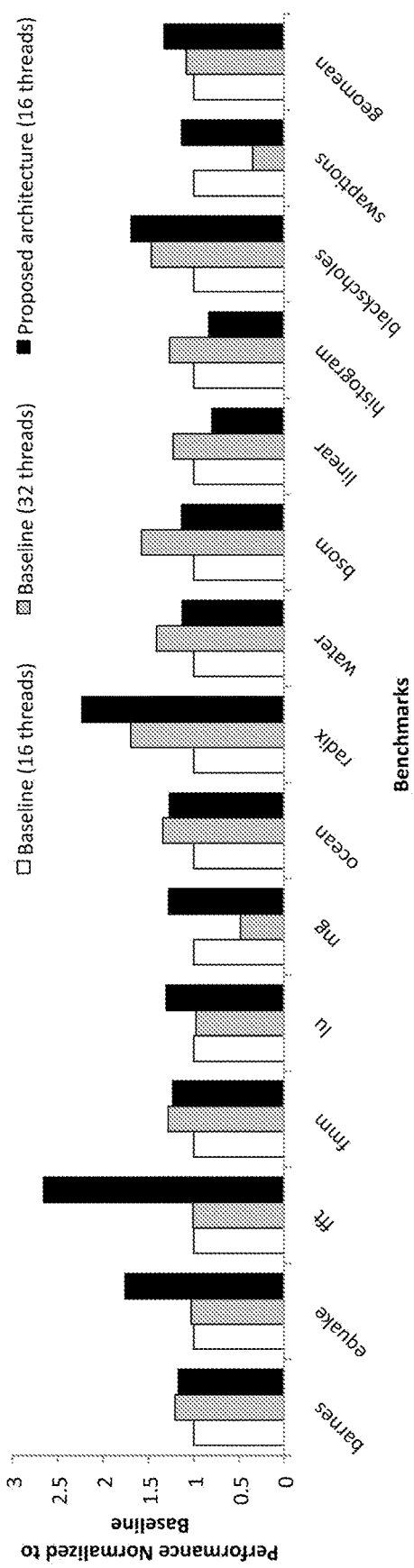
FIG. 14 is a bar graph showing exemplary performance normalized to baseline for various benchmarks.

FIG. 14 compares the performance of the proposed architecture to a baseline CMOS processor. The ERSFQ processor runs the applications with 16 threads, whereas the baseline processor is evaluated with both 16 and 32 threads. On average, the ERSFQ processor achieves 32.5% higher performance than CMOS with 16 threads. For two benchmarks, linear regression and histogram, the proposed architecture performs worse than the baseline. Compared to other benchmarks, these applications execute a higher proportion of store instructions, and the store wheel writing delay causes the performance degradation. The best baseline performance is achieved at 32 threads (8 cores, 4 threads per core). On average, a 22.4% speedup is obtained over this baseline run with 32 threads

7.2 Energy

Figure 15:
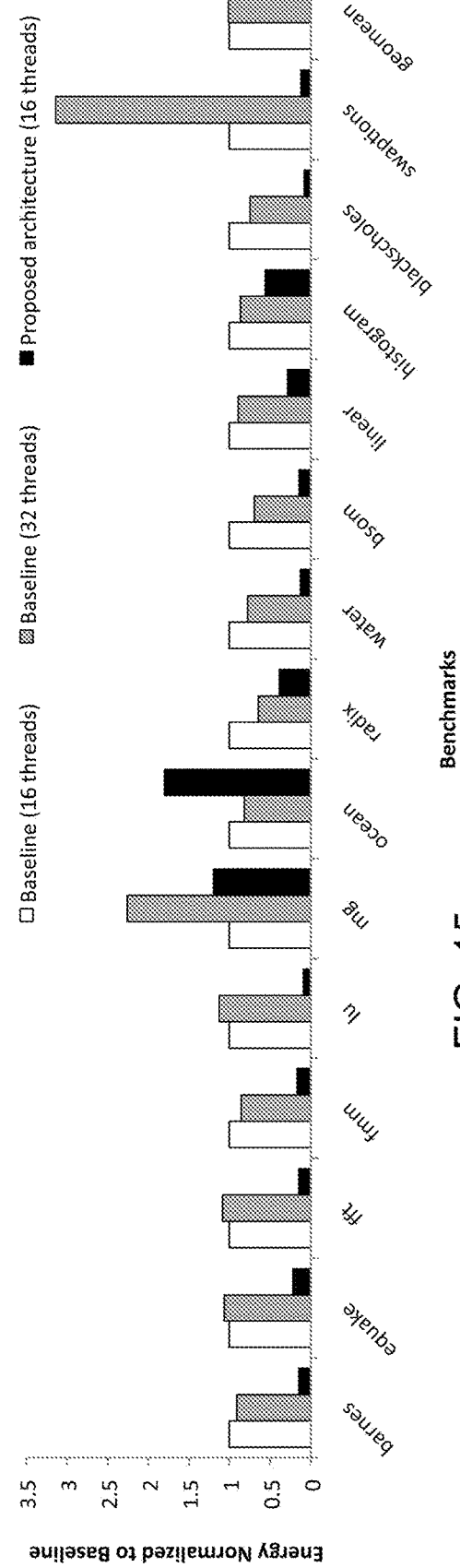
FIG. 15 is a bar graph showing exemplary energy normalized to baseline for various benchmarks.
Figures 16, 17:
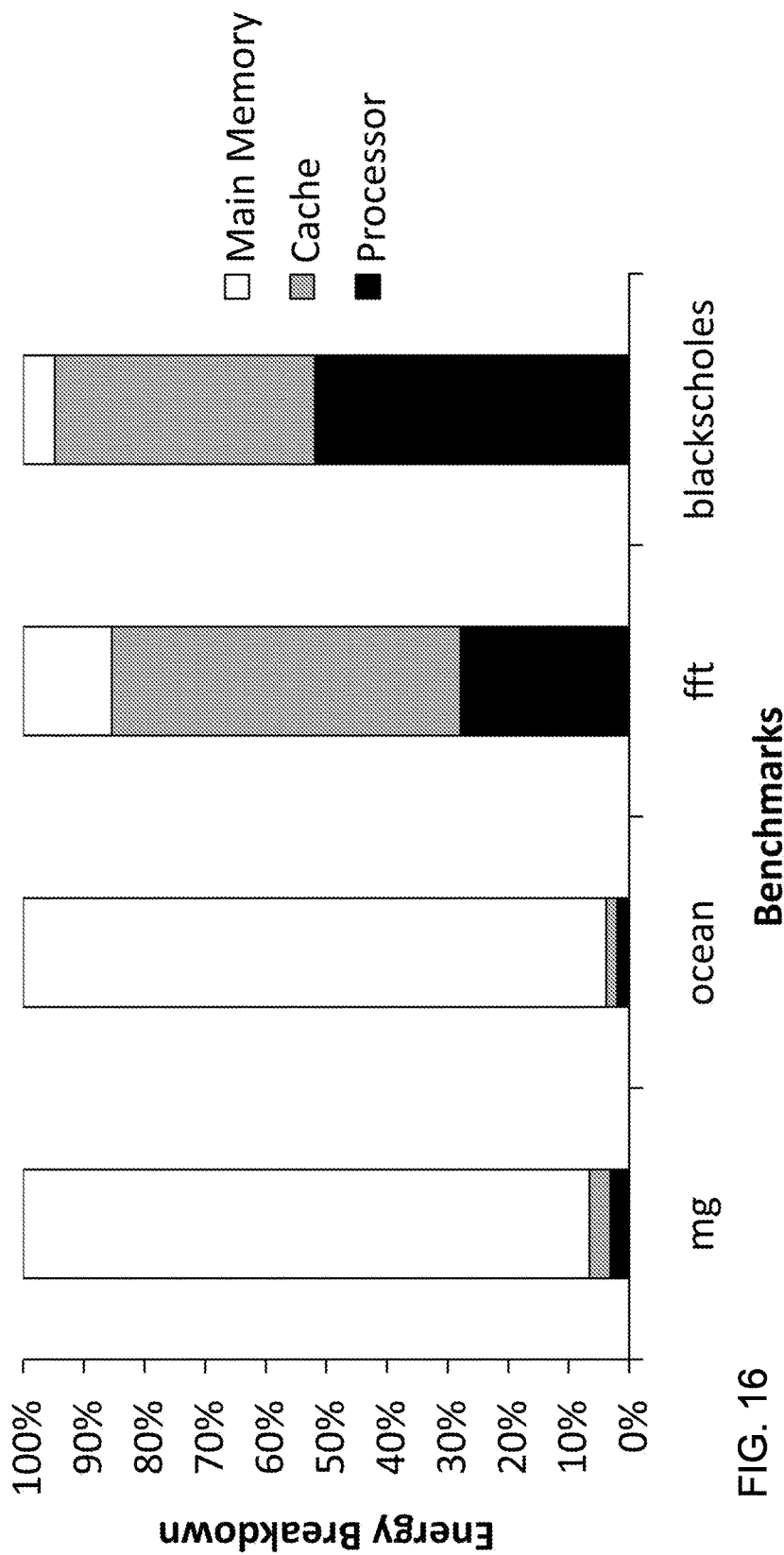
FIG. 16 is a bar graph showing an exemplary energy breakdown for various benchmarks.
FIG. 17 is a table 4 showing areas of an processor, off-chip cache and main memory as an exemplary embodiment of the new architecture.

FIG. 15 shows an energy comparison between the proposed architecture and two configurations of the baseline system: one with eight cores and two threads per core (which is the most energy-efficient baseline configuration), and another with eight cores and four threads per core. The proposed architecture reduces the energy consumption by 4.3× on average. However, for benchmarks mg and ocean, the energy consumption of the proposed architecture is worse than the baseline. The reason as shown in FIG. 16 is that the main memory dominates the energy consumption of these two benchmarks. Since DRAM based cryogenic memory is not as energy-efficient as ERSFQ (or MJJs), the energy saved on the processor is not sufficient to compensate for the energy consumed by the refrigeration system. It is contemplated that energy consumption can be further reduced by introducing RSFQ compatible energy-efficient main memory.

7.3 Area

The area evaluation of the proposed architecture is shown in Table 4 of FIG. 17. At the current RSFQ technology node, the area of the processor and the off-chip L2 cache is much larger than similar components designed in CMOS technology. However, given the volume of the cold boxes in existing cryostats (e.g., 2.0 m×1.6 m×2.6 m [27]), the area is not a limiting constraint: the scale of the computer system that can be housed in a cryostat is primarily determined by power and cooling budgets rather than area.

7.4 Scaling to Future Technology Nodes

Figure 18:
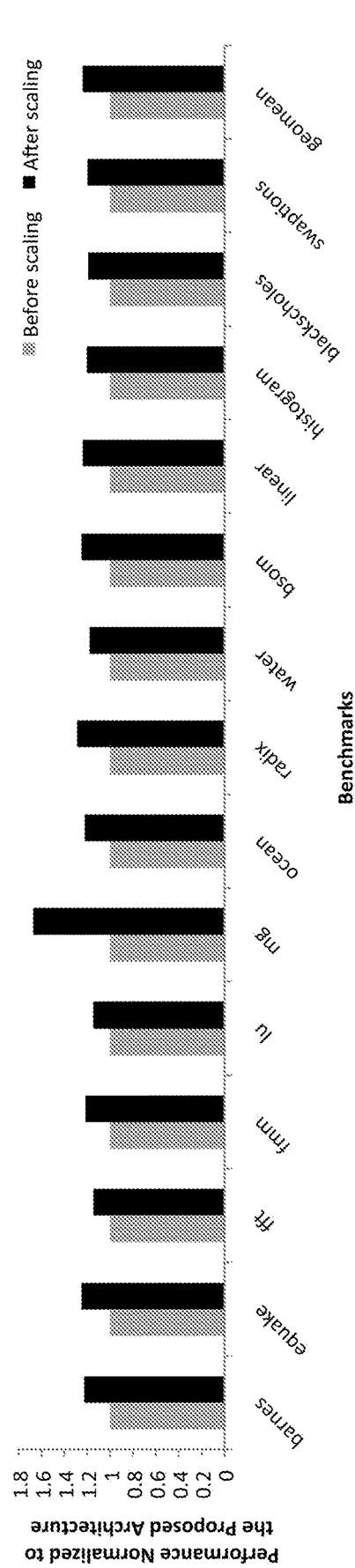
FIG. 18 is a bar graph showing performance normalized to the new architecture for various benchmarks.
Figure 19:
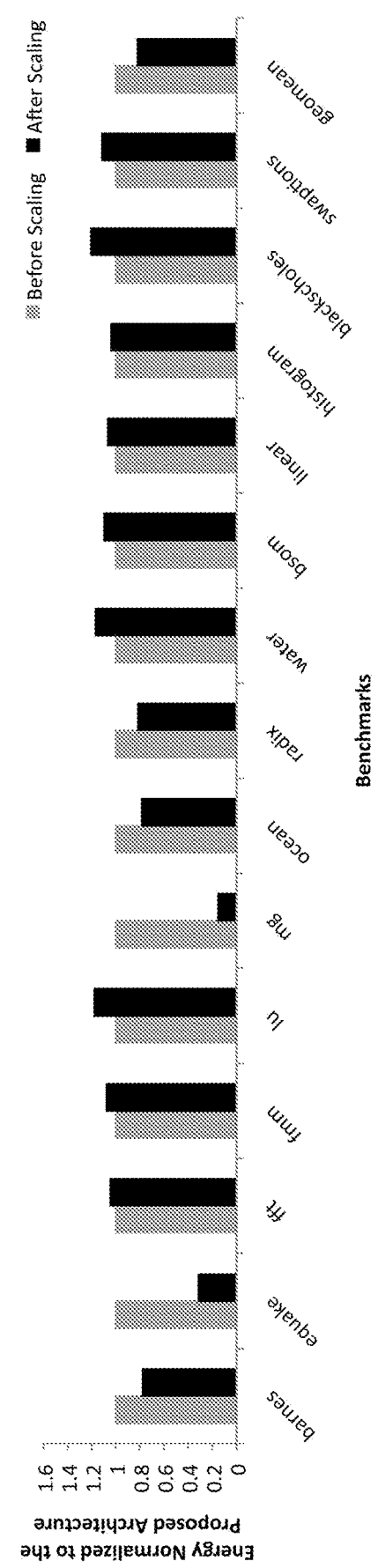
FIG. 19 is a bar graph showing energy normalized to the new architecture for various benchmarks.

To examine the potential of the proposed architecture under technology scaling, we study how the system scales under two different sets of assumptions. First, the system is scaled based on the increased JJ density that allows the size of the L1 and L2 caches to be doubled, and the L2 tag array and the MSHRs to be placed on chip. Second, we consider scaling the clock frequency based on the increased critical current density. Specifically, a core clock speed of 25 GHz and a wheel clock frequency of 75 GHz are evaluated. The performance and energy improvements of the proposed architecture after scaling are shown in FIG. 18 and FIG. 19, respectively.

The performance improvement of the scaled architecture is application dependent. For memory intensive applications (mg, equake, ocean, and radix) whose working sets fit in the enlarged cache subsystem, the increased cache capacity dramatically reduces the number of main memory accesses, and improves performance. For bsom, the performance improvement is mainly due to the on-chip L2 tag array and MSHRS after scaling. Other benchmarks benefit from the increased clock frequency, but the performance improvements are limited by the wheel latency. On average, the scaled architecture outperforms the unscaled one by 23.1%.

For the applications that have many L2 cache misses in the unscaled configuration of the proposed architecture, most of the energy is expended on inefficient DRAM based main memory. As the capacity of the L2 cache increases, these applications achieve lower energy. For other benchmarks, the energy consumption does not change significantly because of the peripheral circuitry overhead of the large cache

8 Related Work

Given the theoretical advantages of RSFQ over CMOS, a number of efforts to use RSFQ as a possible alternative technology have been made. One important aspect of making RSFQ a viable alternative to CMOS is the development of fast, wide ALUs. There have been a number of fast ALU designs utilizing Kogge-Stone and sparse tree designs with various functionalities [1, 12, 15]. Another focus of research in this area is the search for an appropriate memory technology. Early work focused on using native SFQ based memories such as NEC's vortex transitional [43] memory, but these approaches suffered from limited density. Other work on RSFQ memories has attempted to use CMOS memories, both SRAM and DRAM, in a cryogenic environment. There have also been a number of proposed RSFQ microarchitectures. The Flux-1 [7, 14, 16] was an eight-bit, dual issue LIW processor where operations could only occur between adjacent registers to minimize wire lengths. The Corel [61] was another eight-bit microprocessor that used a more traditional four stage pipeline design with two sub-stages per pipeline stage. The COOL-0 [13] was an RSFQ processor proposed for the Hybrid Technology Multi-threaded (HTMT) architecture project. COOL-0 used a multithreading architecture to hide latencies with multiple thread groups that shared functional units. The Frontier architecture [11] was a 32-bit processor that organized the register file four eight-bit. In contrast to the prior work the proposed design represents a complete computer system, with a novel wheel concept that makes high capacity register files, store queues and MSHRs possible.

9 Summary

We described hereinabove new superconducting architectures for parallel applications using ERSFQ. To exploit the unique properties of RSFQ gates with natural latching behavior and high switching speed, a deeply pipelined architecture uses fine grained multithreading of ERSFQ gates. A novel wheel structure uses a free running circular shift register to provide a register file and searchable queue functionality. In some exemplary embodiments, the proposed memory subsystem uses MJJs for the cache and 1T-DRAM for the main memory. Overall, the architecture achieves a 1.2× performance improvement over a baseline system with a 4.3× lower system energy.

Using new such new architectures as described hereinabove, ERSFQ holds significant potential for data center applications, and offers a number of potential avenues for future research. This includes a memory subsystem better designed for cryogenic operation, and increased single thread performance made possible through out-of-order execution.

10 Example Datacenter in a Cryostat

Figure 20:
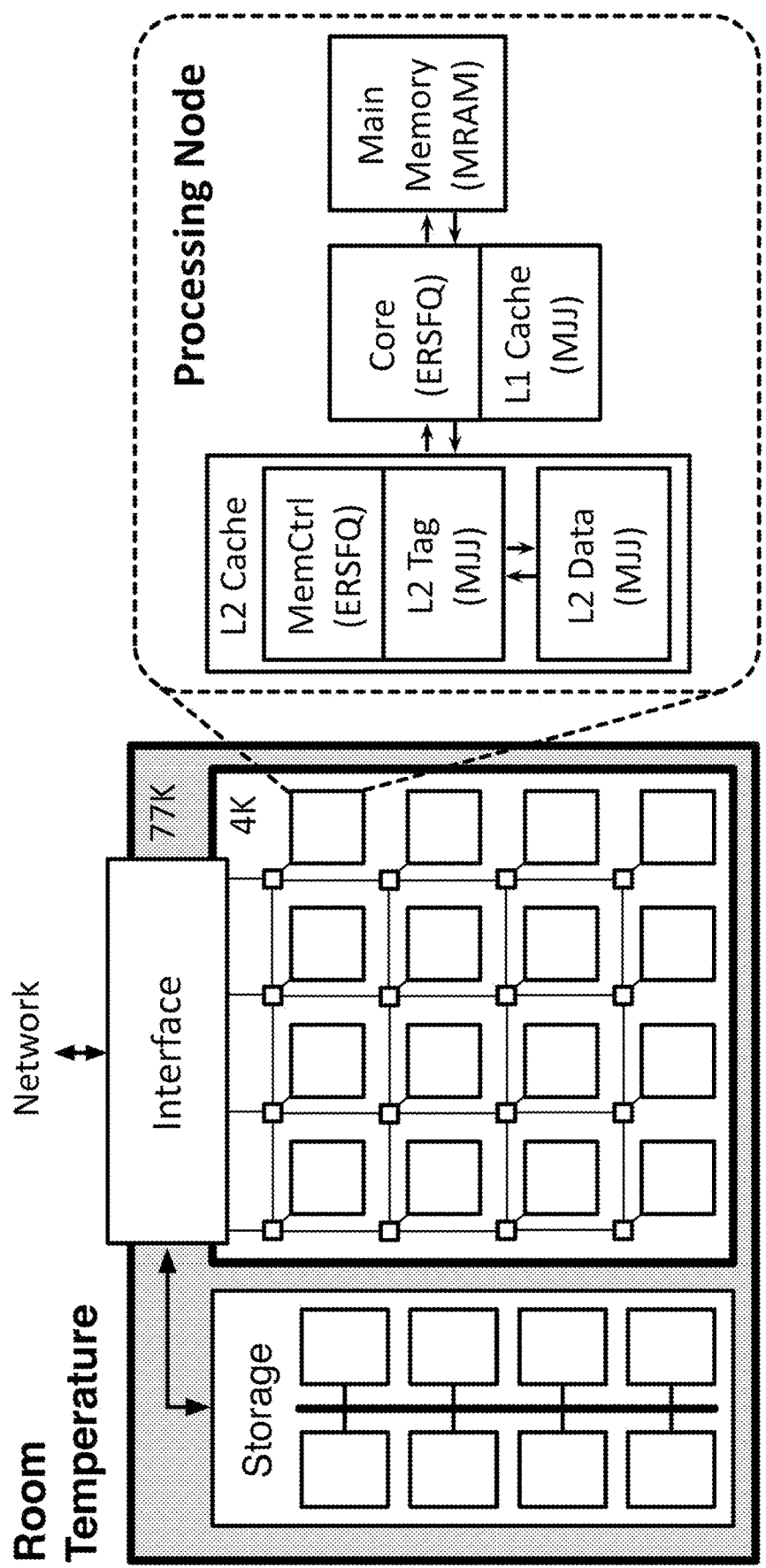
FIG. 20 is a block diagram showing an exemplary system overview.

The exemplary datacenter in a cryostat includes a system of compute nodes, each with processors and a supporting memory hierarchy, interconnected by a networking fabric to primary storage (FIG. 20). Each subsystem will be designed to exploit the speed and functionality of ERSFQ circuits to realize performance superior to existing datacenters.

10.1 Fundamental Building Blocks

A computer system using JJ technologies uses architectural and circuit solutions to amortize the high cost of memory components. Implementing conventional register files, on-die random access memories (RAMs), and content addressable memories (CAMs) with ERSFQ logic is inefficient. Two new building blocks introduced hereinabove reduce the cost of memory components in ERSFQ-based processors: a storage wheel and a clearable FIFO. DRO buffers, capable of high-speed and low-power pulse propagation are employed to perform fast read, write, and search operations.

10.1.1 Implementing Efficient RAM and CAM Circuits with Storage Wheels

Figure 21:
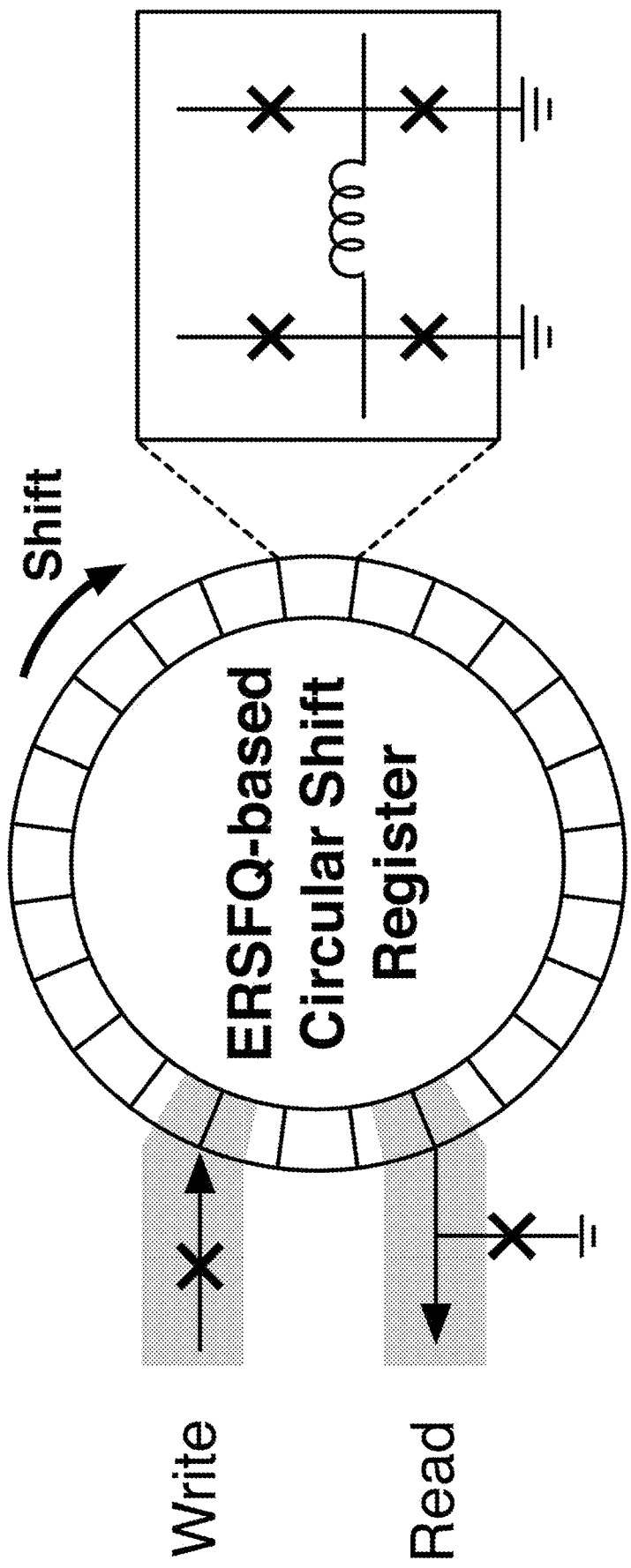
FIG. 21 is a diagram of an exemplary wheel architecture.

The storage wheel includes a circular shift register made of DRO cells, plus a set of read and write ports placed at one or more locations on the wheel (FIG. 21). Using DRO registers instead of NDROs results in a reduction in JJ count. As shown in FIG., a memory access (read or write) is performed through a single JJ. The simple structure of the storage wheel allows higher frequency operation than the rest of the processor, thereby reducing the average access latency. The wheel structure will be used to implement many of the conventional RAM and CAM structures (e.g., register file, issue queue, and reorder buffer) in microprocessors.

Reading and Searching: Each entry of the proposed storage wheel stores a data block, a tag, and a valid bit. Every storage wheel cycle, the wheel rotates by one entry, and a different entry will become accessible through its read port. The contents of each entry becomes successively available at the read port (FIG. 21), which produces an output stream of entries within the wheel. This stream will be directed to a comparison logic for read or search operations.

Writing: Updating the contents of the proposed storage wheel uses a series of read-modify-write operations. For every wheel cycle, the tag bits of the current wheel entry will be compared against the tag bits of the destination data block; on a match, the data bits will be overwritten with their new contents. A write port will include a splitter and a merger to support the read-modify-write operation. The merger will be separated from the splitter by as many wheel entries as the number of rotations that take place while a comparison is ongoing. This separation will make it possible to synchronize the entry update with the end of the tag comparison.

Multiporting: An advantage of the proposed storage wheel as compared to conventional RAM and CAM architectures is its port scalability. The proposed mechanism for serially accessing data in the wheel allows additional ports to be added without modifying the shift register. An additional read port uses only a single JJ to increase the fan-out, and duplicating the comparison logic for the second output. Similarly, an additional write port requires adding only three JJs to the write splitter or merger. This approach makes it possible to multiport the storage wheel without a significant area or latency penalty.

10.1.2 Performance Optimizations for the Storage Wheel

The major limitation of the storage wheel is that increasing its size results in a commensurately higher access latency. To prevent the access latency of a large wheel structure from becoming a major performance hurdle, a number of optimizations will be explored.

Port placement: The location of the read and write ports within a storage wheel has a dramatic effect on the average access latency. For example, placing a read port close to a write port allows fast communication between a write and a subsequent read to access the wheel back-to-back. The proper location of ports can be optimally configured for each of the hardware resources implemented with a storage wheel.

Data replication: One approach to reduce the worst case latency duplicates data at multiple locations within the wheel. This method reduces both the average and worst case latency without requiring any additional ports. Policies and circuits will be developed (1) to determine performance-critical entries and scenarios that benefit from replication, (2) to properly space replicas within the wheel, and (3) to track and invalidate unused entries.

Request scheduling and entry placement: Scheduling policies will be developed to translate the temporal locality of consecutive accesses into spatial locality within the wheel. In applications with tightly coupled dependence chains, this optimization will reduce the average read latency.

Dynamic port assignment: Dynamic assignment of one or more ports to each read will allow the wheel to trade-off latency against bandwidth. Every read will utilize one or multiple read ports. If multiple ports are assigned to a single read, the average access latency will be reduced at the cost of reduced read bandwidth. In contrast, if each read is allowed access through a single port, the wheel access bandwidth will be increased at the cost of a longer average latency. Techniques will be developed to adaptively manage and assign ports based on runtime utilization.

Port prediction: Assigning individual ports to an incoming access can anticipate the likely location of the requested entry within the wheel. Prediction techniques will be developed to assign an incoming read to the read port closest to its target entry.

Hierarchical wheels: A storage wheel can incorporate multiple sub-wheels to reduce the average access latency. A small, low-latency wheel can be complemented by a large, high-capacity wheel to deliver reduced latency without sacrificing capacity. Entries can be placed and migrated between the wheels. For example, it is contemplated that data partitioning and static placement can achieve this functionality without incurring a high hardware cost.

10.1.3 Clearable FIFO

Figure 22:
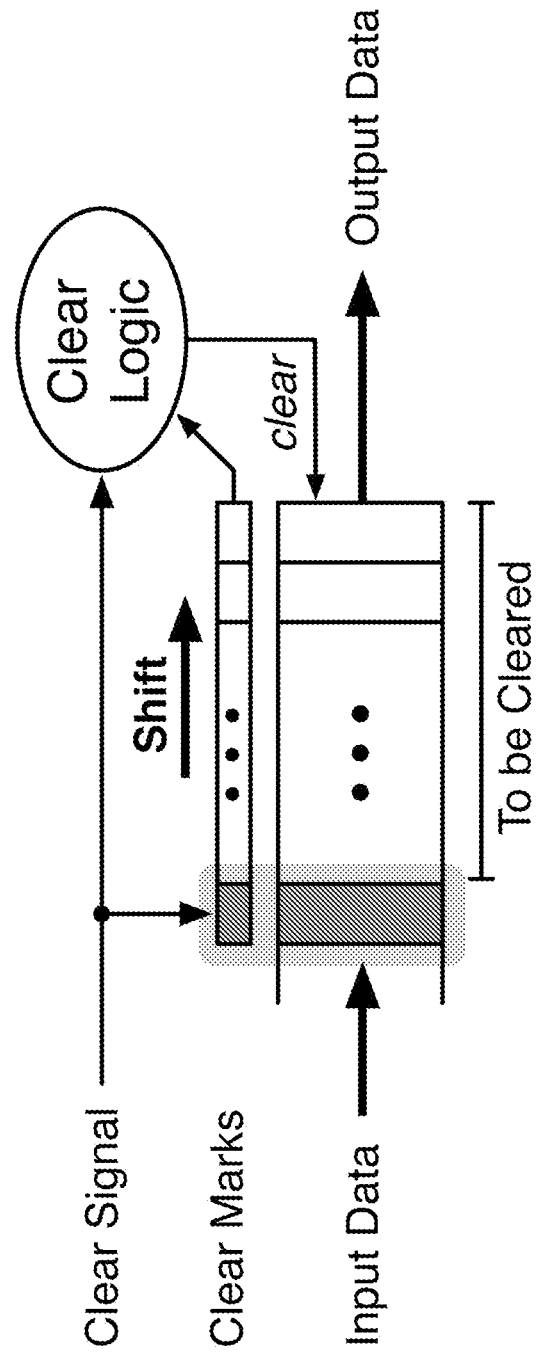
FIG. 22 is a diagram of an exemplary clearable FIFO.

A clearable FIFO (FIG. 22) is a new ERSFQ structure that can be used within the architectures described herein. Generally, MJJs are not suitable for fast FIFO queues because of their long write latency. The proposed design builds upon existing asynchronous FIFO [35] circuits, with new mechanisms to flush the queues quickly.

Unlike a RAM based FIFO that can be flushed by resetting its head and tail pointers, an asynchronous FIFO must have every entry cleared sequentially. This serial clearing mechanism can be a substantial performance bottleneck in modern processors that rely on speculation. A clearable FIFO that allows fast, serial flush operations can limit the impact of latency. A clear mark can be associated with each entry in the FIFO. The clear mark can be initialized to zero during normal operation; when a clear is required, the clear mark can be set to one, and a clear logic will be enabled. The clear logic will sequentially remove all the entries until the clear mark reaches the head of the queue, returning the FIFO to normal operation. While the clear operation is in progress, new valid entries can be inserted into the FIFO. Unlike conventional RAM based queues, the clearable FIFO facilitates the asynchronous operation of individual pipeline stages, and is therefore not bound by the hard timing constraints of a global clock signal [74].

10.1.4 Clocking Synthesis and Dynamic Control for Globally Asynchronous, Locally Synchronous Operation The storage wheel and the clearable FIFO can exploit the self-latching property of ERSFQ circuits, allowing pipeline stages to operate at independent frequencies for greater power efficiency. This globally asynchronous, locally synchronous (GALS) operation uses a novel clock distribution and synchronization methodology capable of both locally controlling clock signals and optimizing delays across branching logic paths.

Fine-grained dynamic frequency scaling. Fine-grained dynamic control of the clocking system uses an efficient mechanism to modulate the clock frequency locally. Statistic counters can be added to determine runtime resource demands which will dynamically prompt frequency changes. These circuits will drive a series of multiplexers that control the clock pulses driving the local circuitry. The global clock can be downconverted using T flip-flops.

ERSFQ clock network retiming. Aggressive ERSFQ clocking schemes advocate concurrent propagation of data and clock signals [73,74]. In logic trees and interdependent loops, however, the clock pulse can arrive at each branch at a different time, potentially causing timing errors. Splitters and mergers within the clock network can be placed to change the arrival time of the clock pulses along a data path, thereby shortening the worst case delay. A splitter and merger placement methodology can be used to synchronize multiple logic branches, and ensure proper timing.

10.2 Processors

The architecture and circuits described herein can use both in-order and out-of-order (OoO) processor cores. Both types of cores can use the fundamental building blocks described in Section 10.1. The cores can be optimized for performance and energy efficiency based on the characteristics of ERSFQ logic.

10.2.1 in-Order Cores

Figure 23:
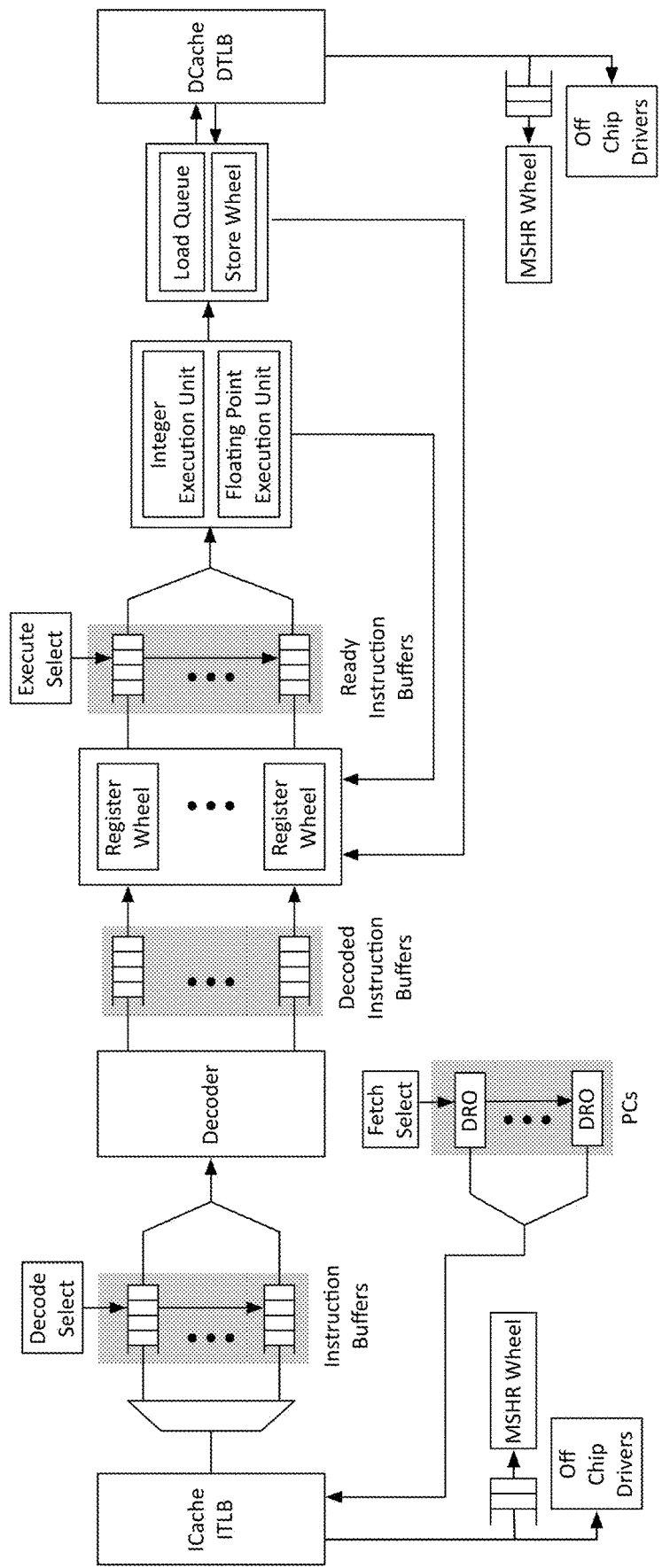
FIG. 23 is a block diagram of an exemplary ERSFQ based in-order processor core.

In-order cores comprise six major pipeline stages: fetch, decode, register read, execute, memory, and write back. These stages are connected through the clearable FIFO described in Section 10.1.3 to allow different stages to operate at different clock rates (FIG. 23). Since ERSFQ logic gates can switch fast and hold state, most of the major stages will be further partitioned into minor pipeline stages. Thus, the ERSFQ processor will be deeply pipelined without incurring the overhead of extra pipeline registers that is needed in a deeply pipelined CMOS processor. In some embodiments, to keep the pipeline busy, the processor will use fine grained multithreading with sixteen thread contexts.

Front-End: The proposed fetch unit consists of a thread selector, a program counter (PC) for each thread context, an adder to compute the next PC, and control logic.

One important challenge in a multithreaded architecture is thread selection. Since multiplexers and many other complex logic gates are expensive in ERSFQ, a single monolithic selection logic may not be area efficient. More JJ efficient schemes utilizing gates with a low JJ cost can be considered to find a balance between JJ budget and processor utilization. One possible way to reduce the cost of the selection logic is to use multi-level selection, in which threads will be grouped, and a simple round robin policy selects one of the groups each cycle. Within the selected group, a low-radix priority encoder can pick the highest priority thread. This approach allows some multiplexers to be replaced by much more efficient mergers, reducing the internal fanout of the priority encoders. Because the processor will be deeply pipelined and branch address computations will use multiple cycles, the fetch engine will use a simple static branch prediction scheme (always not taken). During each clock cycle, the PC of the selected thread will be sent to the instruction cache.

The decode stage will utilize similar selection logic to choose the next instruction to decode. It is contemplated that a pipelined decoder can be used, while minimizing the use of complex logic blocks. One approach is to use mergers and inverters, respectively, at three and five JJs per gate, to design NOR based decode.

Register Wheel Access: The register file includes the storage wheel discussed in Section 10.1.1. Each wheel entry contains a valid bit, a register specifier, and a register value. Register wheel read ports accept three values for comparison, up to two source operands, and a destination operand. When the destination operand is found, the storage wheel entry can be reset, and subsequent instructions will be prevented from reading the stale register content.

Execute: After accessing the register wheel, the instruction is sent to a ready instruction buffer shared by a group of threads, and will be selected for execution using the pseudo round-robin scheme described above. Both the ALU and the FPU can be deeply pipelined to maintain a high clock frequency. The integer ALU and the multiplier can exploit existing work [12,1,15]. An ERSFQ barrel shifter can exploit handle shift instructions. Because most of the existing ERSFQ floating point adders and multipliers are bit-serial, it is contemplated that a new, 32-bit, deeply pipelined ERSFQ FPU can be used.

The new architecture described herein resolves branches in the execute stage; if the condition indicates a taken branch, the branch address and the branch signal are sent to the front-end to redirect fetch. The branch signal is also sent to the decode and register wheel stages for recovery. After execution, the result is stored in the load/store queue as an effective address if the instruction is a load or a store; otherwise, it is placed in an ALU result buffer with its destination register specifier and thread ID, where the result awaits writeback.

Figure 24:
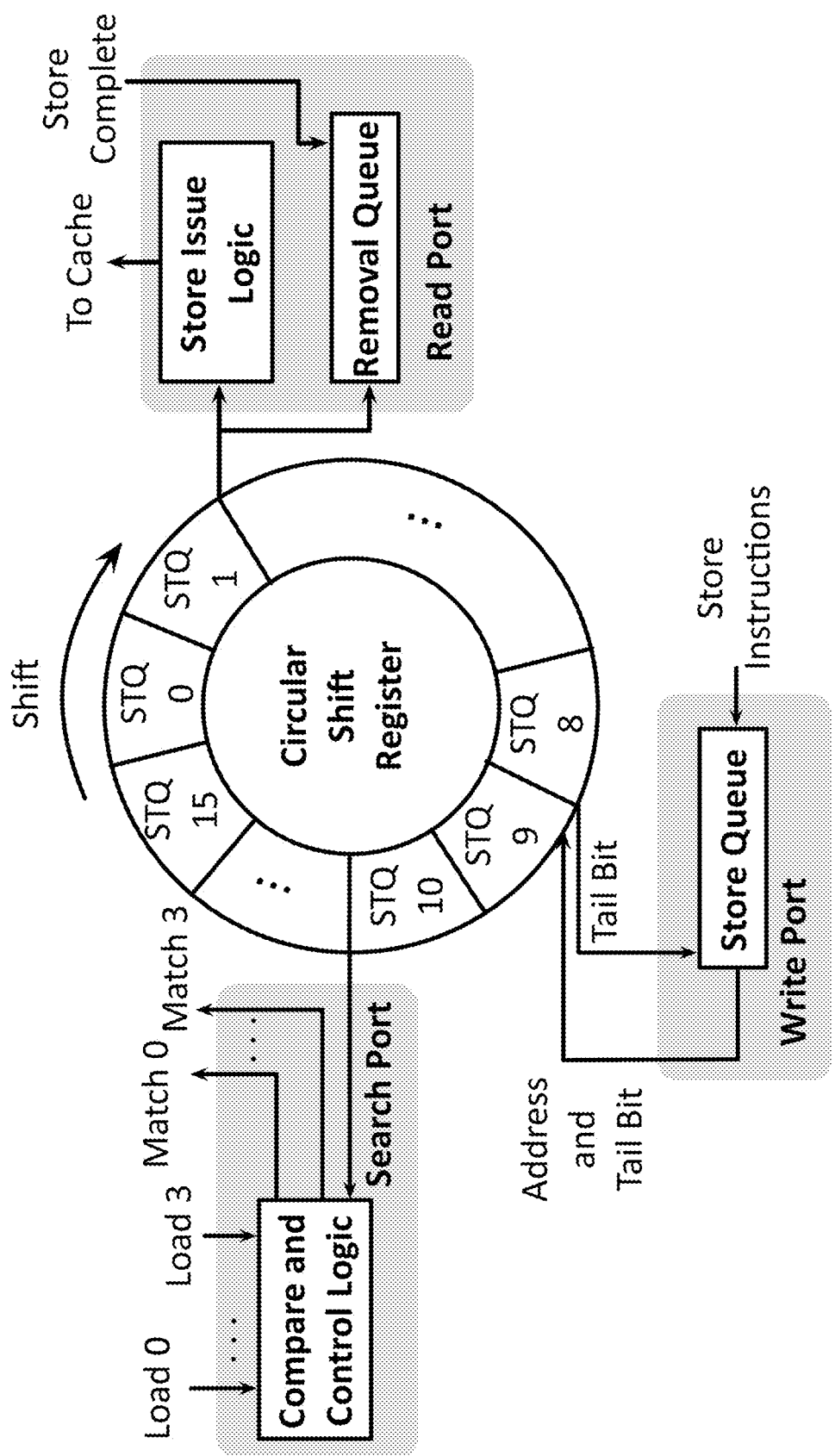
FIG. 24 is a diagram of an exemplary store wheel.

Memory Access: To support load-store forwarding and increase memory level parallelism, another wheel structure can be used. To maintain ordering, loads and stores can place a single-bit flag in a shared bookkeeping queue, and can be inserted into separate load or store queues. The store queue can act as the write buffer for the store wheel shown in FIG. 24. To prevent searching the store queue from becoming a bottleneck, the store queue can be multiported.

One important complication of the store wheel is the ordering within the queue. We contemplate adding an additional head and tail bit to each store wheel entry to track the age of instructions within the wheel. Using head, tail, and valid bits, it is possible to know the relative age of all entries. The store wheel can be accessed in parallel with the L1 cache on a load. In addition to allowing loads to search its contents, the store wheel will also be responsible for issuing store requests to memory.

MSHRs can also use a storage wheel. Since the MSHRs have no ordering requirements, the MSHR wheel write logic can simply look for an empty entry on a primary miss.

Writeback: Completed instructions can write their results into a write buffer that services the register wheel of the corresponding thread. This write buffer can write instructions back to the wheel when an available slot is found. The port placement optimization, which places the write port directly before the read port (Section 10.1.2), can speed up dependency chains.

10.2.2 Out-of-Order Cores

Figure 25:
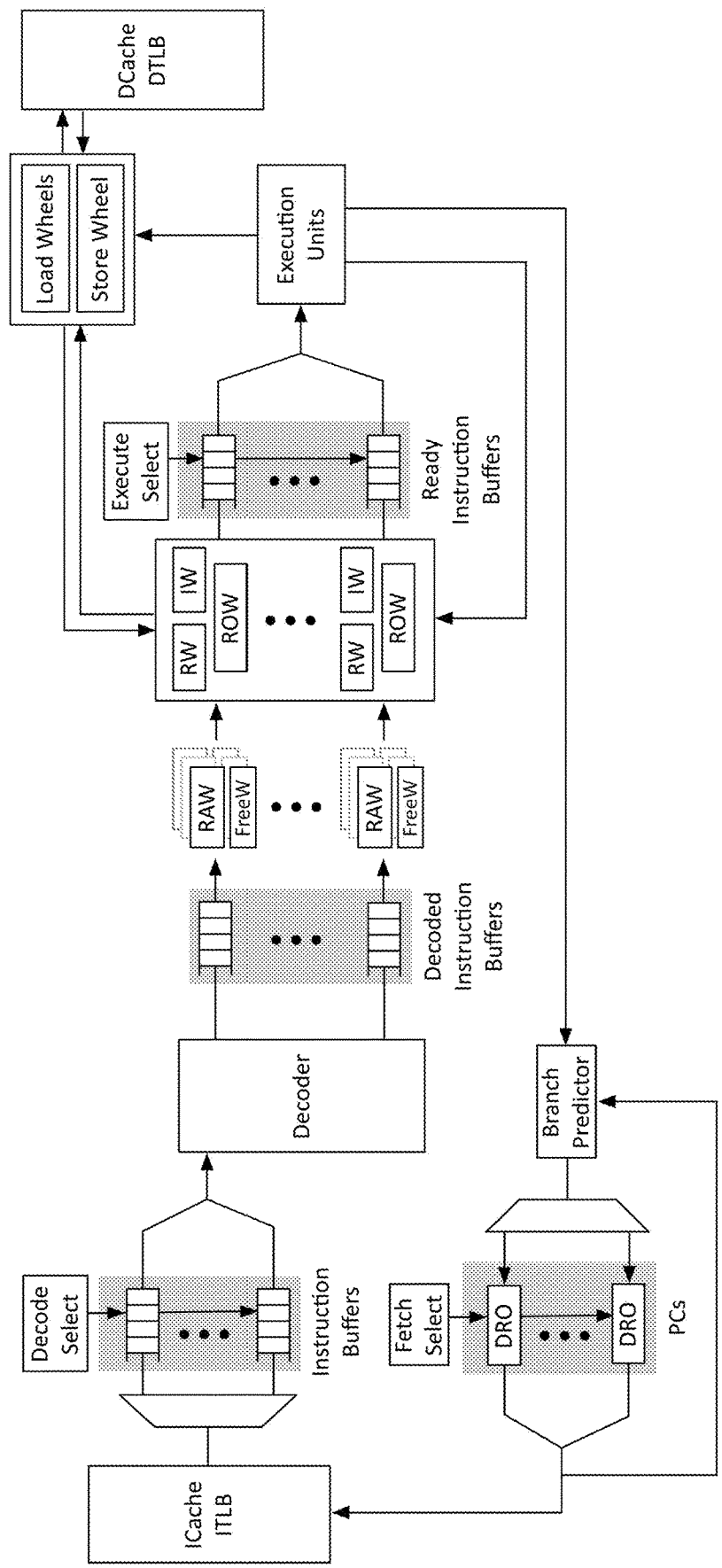
FIG. 25 is a block diagram of an exemplary out-of-order ERSFQ based processor.

It is contemplated that out-of-order core based on wheel structures can be used to improve single-thread performance within an acceptable energy budget. FIG. 25 shows the main components of an exemplary out-of-order core.

Front-end: Similar to the proposed in-order core, the OoO core can employ program counters and control logic in its front-end. A dynamic branch predictor can use MJJ-based tables to reduce the area overhead. Maintaining sufficient write throughput when updating the predictor will likely be a challenge due to the high write latency of MJJ devices (8-12 cycles). To address this issue, we exploit a banked predictor organization with write policies that allow for hiding the MJJ write latency. New management techniques can be used to reduce bank conflicts in the branch predictor. For example, the tables can be indexed through a hash function that uses the least significant bits of the PC for bank selection. This method distributes the branches within a narrow execution window across the table banks. It is contemplated that more sophisticated bank management techniques that can be trained as the program executes can also be used.

Figure 26:
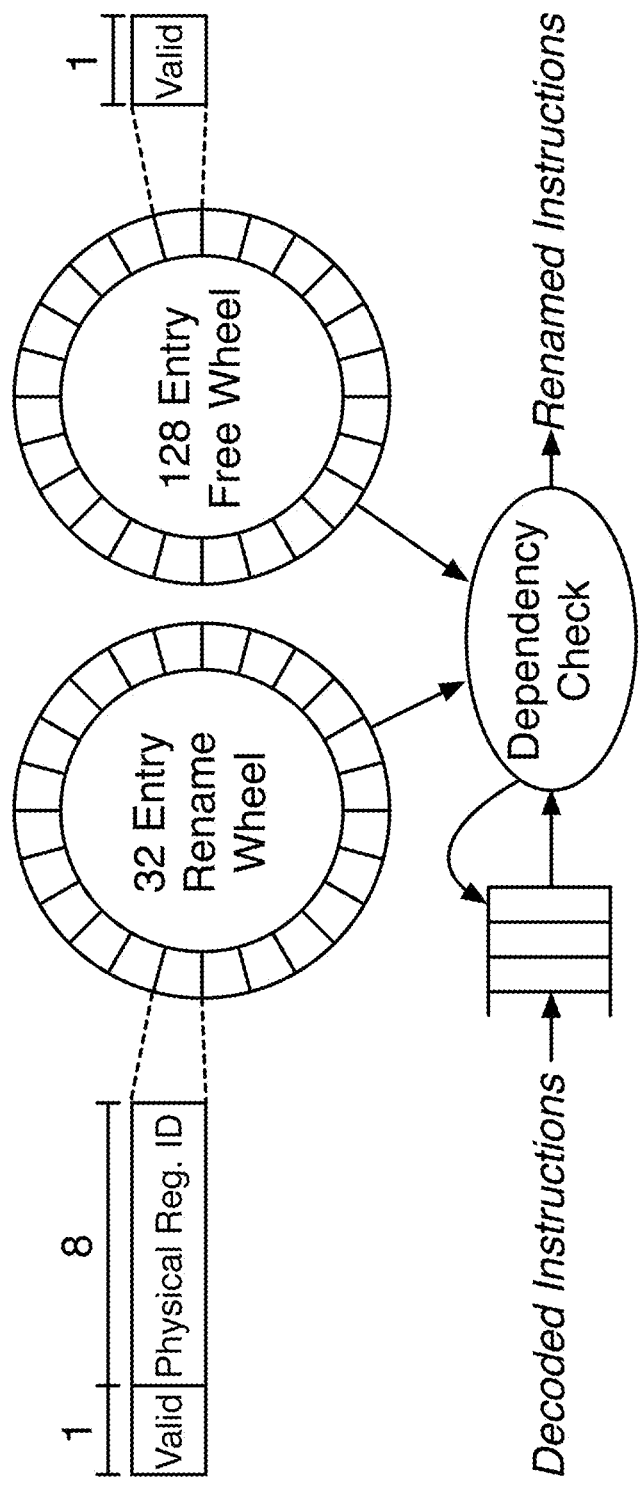
FIG. 26 is a diagram of an exemplary rename architecture.

Rename: We will explore a novel ERSFQ-based register alias wheel (RAW) for register renaming. FIG. 26 illustrates an overview of the proposed register renaming mechanism. In the FIG. 26, the RAW maintains a list of all of the renamed registers. For every decoded instruction, the architectural source register specifiers are placed at the search ports, where they await the matching RAW entry to read out the corresponding physical register specifiers. A physical register specifier is assigned to the destination architectural register from a free wheel containing the list of available physical registers. In the case of a superscalar design, dependency check logic can be employed to resolve the dependencies among instructions within the same rename group. Both the free wheel and the RAW can be checkpointed to support fast and efficient recovery from branch mispredictions. Banking and multiporting techniques can be used to accelerate copying entries between the original and checkpointing wheels.

Register Accesses and Issue: A property of the storage wheel is that a request waits within the wheel until the value is found even with multiple rotations. This property allows the register wheel to implement the wake-up mechanism within an issue queue without a wide broadcast bus. If an operand is unavailable when an instruction attempts to access the wheel, the instruction must remain in the wheel until the operand is computed and written back. This structure is a natural extension of the basic register wheel operation in the in-order processor as used herein. The physical register wheel should be multiported to support OoO operation; however, since one goal of the wheel structure is to limit the number of comparators required by a traditional CAM structure, not all instructions in the issue queue will be able to simultaneously search the wheel. It is contemplated that there is a balance between the number of search ports on the wheel and hardware complexity, and that optimizations such as those discussed in Section 10.1.2 can be used to limit the performance impact.

Instructions that have completed searching the wheel will send a signal to an arbiter for selection to be issued to the execute stage. Because the choice of search port does not indicate the age of an instruction, scheduling techniques can be used to determine which instruction to issue.

Execution: The deep pipeline used to achieve high clock frequencies in the in-order core results in a multi-cycle ALU latency, even for simple operations such as addition. These latencies are tolerable for an in-order processor with a large number of hardware threads; however, in an OoO processor with a few hardware threads, the ability to execute a chain of dependent instructions back to back is important. To allow this capability, the ALUs can facilitate partial value forwarding. In the case of addition, for example, a nibble serial approach can be used to forward partial results to dependent instructions that can use them. Existing benchmarks can be profiled to determine which ALU operations are commonly seen in execution chains.

Memory Access: The store wheel can be designed similar to the in-order core described hereinabove. The load queue can use wheel structures instead of a FIFO to support recovery from branch mispredictions. In some embodiments, there will be two load wheels. The first load wheel will hold load instructions that have not yet been issued to the memory or searched by the store wheel. The second wheel will hold loads after they are issued to the memory subsystem until they are committed. Once the effective address of a load has been computed it can be issued to the memory subsystem. As with the in-order core, the cache can be speculatively accessed in parallel with the store wheel search. Once the cache access and store wheel search have been completed, the load can be placed in the second load wheel. Optimizations such as speculative loads may be appropriate given the limited hardware complexity.

Commit: The reorder buffer can use a wheel structure with multiple ports, called the reorder wheel. The instructions that finish execution or memory access will update a finish bit in the preassigned reorder wheel entry. When the entry marked as the head reaches the commit port of the reorder wheel, the finish bit will be checked, and the entry will be cleared accordingly. A branch misprediction port will compare the branch prediction to the correct result, and flush the subsequent instructions on a misprediction.

Branch Resolution: A branch misprediction will be recovered as soon as the branch direction is resolved. To support this aggressive branch misprediction recovery, branch masks will flush the information along the wrong path in all of the wheel structures. The correct state of the RAW and the free wheel will be recovered by simply copying the checkpointed contents.

10.3 Memory System

Memory in ERSFQ systems has classically been a limiting factor in the development of high performance computer systems. Native JJ-based memories, such as SQUIDs and MJJs, have memory cell areas that are orders of magnitude greater than what is achievable in modern CMOS processes, resulting in very low memory capacity $$\left(1 - 4\frac{MB}{cm^2}\right).$$

It is possible to achieve significantly better density by leveraging SRAM on a separate chip, however this approach requires large and power hungry interface circuitry between the CMOS and ERSFQ circuits. DRAM, which is even denser than SRAM, exhibits the same interface problems. Prominently, ERSFQ circuits lack a pass transistor and therefore cannot electrically isolate individual circuits. Furthermore, the much higher voltage level required by CMOS complicates the design of the interface circuitry, resulting in much larger power consumption than ERSFQ based memories.

It is contemplated that both emerging memory technologies as well as MJJs can be used in an ERSFQ memory hierarchy. Upper level caches and memory structures will use MJJs with protocols to ameliorate the long write latency exhibited by these devices. A new crosspoint memory topology will directly integrate MRAM devices with ERSFQ circuits to overcome circuit isolation challenges. Main storage can use crosspoint RRAM technology, while leveraging the enhanced performance of CMOS within the intermediate cooling region of the cryostat.

10.3.1 Caches

In some embodiments, the new architecture will have a two-level cache hierarchy. The L1 instruction cache, the L1 data cache, and the TLBs will be integrated on the microprocessor die. An off-chip L2 cache will interface with the microprocessor using a standard bus interface.

Both caches can use MJJs, which exhibit read latencies comparable to ERSFQ logic without the interface complexity associated with integrating CMOS memory technologies. MJJs provide low read latency (1 cycle) at the cost of a relatively high write latency (10 cycle), and have limited total capacity, and can be used for upper level caches, with new techniques to mitigate the write latency.

On-Chip L1 Caches and TLBs: The L1 can be shared among all of the threads to avoid the need for a coherence protocol. The cache can be heavily banked and buffered to compensate for the long write latency of MJJs, thereby preventing writes from frequently blocking reads. At the circuit level, MJJ arrays will use a well known SFQ-to-DC converter to convert an ERSFQ pulse into a pseudo-DC signal which will be used in the line and column drivers for the MJJ arrays [45,18].

Off-Chip L2 Cache: In present embodiments, density and integration scale limitations prevent the L2 cache from being placed on the processor die. Therefore, L2 cache will be split among five separate ICs within a multi-chip module (MCM), one containing the tag array and the control logic, and four containing 1 MB data arrays. Since the L2 is off chip, the JJ budget is larger, which allows much greater capacity than the on-chip L1. The L2 MSHRs will use a CAM wheel structure. To increase the available bandwidth for the L2 cache, each L2 cache IC will have a direct bus to the processor die. The relatively low cache capacity of individual caches will be addressed through a combination of measures. Cache compression techniques can be used to reduce the impact of capacity on performance. Additionally, bank, rank, and array sizing can be set to increase the storage efficiency by reducing cache pollution.

10.3.2 MRAM Based Main Memory

Unlike upper level caches, high capacity is used for main memory and poses a significant challenge to realizing ERSFQ based servers. While MJJs provide sufficient density for caches, the density of MJJs and other native ERSFQ memories is not sufficient for main memory. Previous efforts have operated SRAM and DRAM at cryogenic temperatures to provide large scale cryogenic memories [30,56]. Although the density was not an issue in these approaches, the power consumption made CMOS circuits impractical for use within a cryocooler. It is contemplated that an MRAM based crosspoint array structure can be used within the proposed main memory to address these limitations.

MRAM has several advantages for use with ERSFQ [75]. Classical memory technologies such as DRAM and SRAM rely on CMOS pass transistors to isolate bit lines during write and read operations. ERSFQ circuits, however, have no efficient pass transistor available, making circuit isolation a fundamentally challenging problem. Unlike CMOS based memories, toggle-mode MRAM can be written with magnetic fields. As a result, read and write circuitry can be electrically isolated.

MRAM background: Toggle mode MRAM is a mature technology that uses magnetic tunnel junction (MTJ) devices to store a state [76]. Magnetic tunnel junctions are two-terminal resistive elements that operate on the principle of spin dependent conduction through magnetic domains [76,77,78,79]. The device is a stack of ferromagnetic metal on both sides of a tunneling oxide spacer. One of these layers has a fixed magnetization direction. The alternate ferromagnetic layer can flip between two opposite polarities, one polarity parallel to the fixed layer and the other polarity anti-parallel. These two states influence the electrons that pass through the oxide barrier, changing the resistance. A logic 0 or 1 is stored, respectively, as a high or low resistance. By applying magnetic fields in a perpendicular configuration across the MTJ free layer, the device state can be toggled from one state to the other state Addressing the MRAM half select problem at cryogenic temperatures: Despite the availability of some commercial products, large-scale MRAM has been elusive due to the half select problem, where memory cells adjacent to the selected cell may be inadvertently disturbed due to stray magnetic fields. Half select disturbance, however, is a stochastic process that is exponentially dependent on temperature. At cryogenic temperatures, the potential for a half select error is exponentially smaller. As a result, the half-select problem is no longer an issue. An analysis can be done, for example, by use of micromagnetic simulation tools to determine the potential for degradation. This information can be used to optimize device structure and error correction codes to ensure that the memory subsystem is robust to potential erroneous bit flips.

Figure 27:
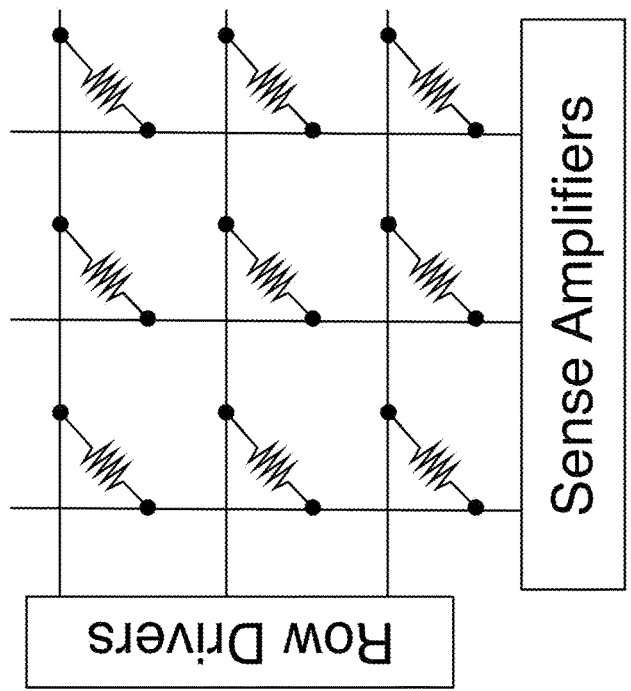
FIG. 27 is a schematic diagram of an exemplary crosspoint circuit.

MRAM cell and array topology: MRAM can be organized into a high density crosspoint structure, as depicted in FIG. 27. For reads, an SFQ-to-DC converter can apply a pulse to the array while the rest of the array is biased low. In some embodiments, a sense amplifier at the bottom of the selected column will sense the state of the MTJ.

Figure 28B:
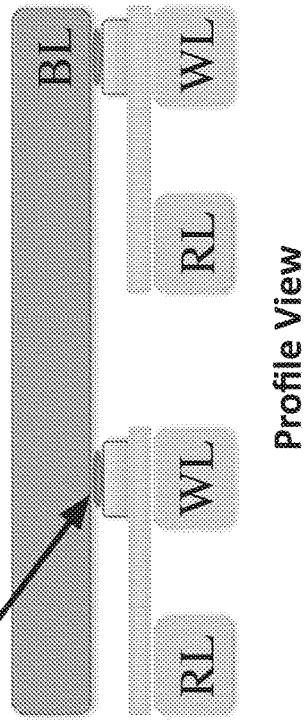
FIG. 28B shows a profile view of the crosspoint circuit of FIG. 28A.
Figure 28A:
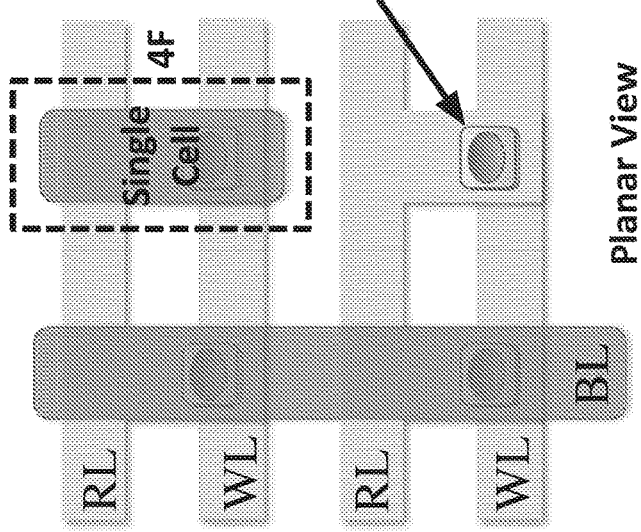
FIG. 28A shows a planar view of an exemplary crosspoint circuit.

It is contemplated that write circuitry can use fields to modify the state of the device, and, in some embodiments, will exhibit the physical structure shown in FIG. 28A (planar view) and FIG. 28B (profile view). The additional line passing underneath the MTJ will act as the write line for the row which will generate a magnetic field to switch the MRAM state. The column write line can be located above in a perpendicular direction. During a write, a current will pass through both lines to switch the device.

Figure 29A:
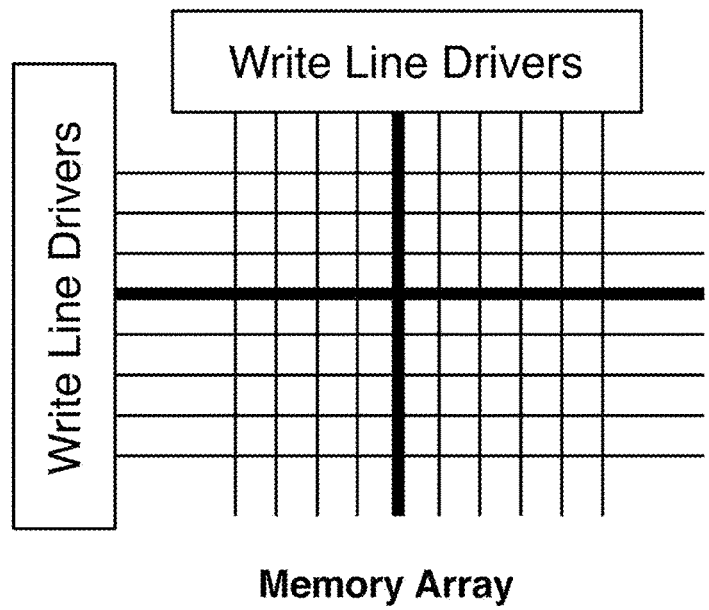
FIG. 29A shows a diagram of an exemplary field based MRAM write circuit.
Figure 29B:
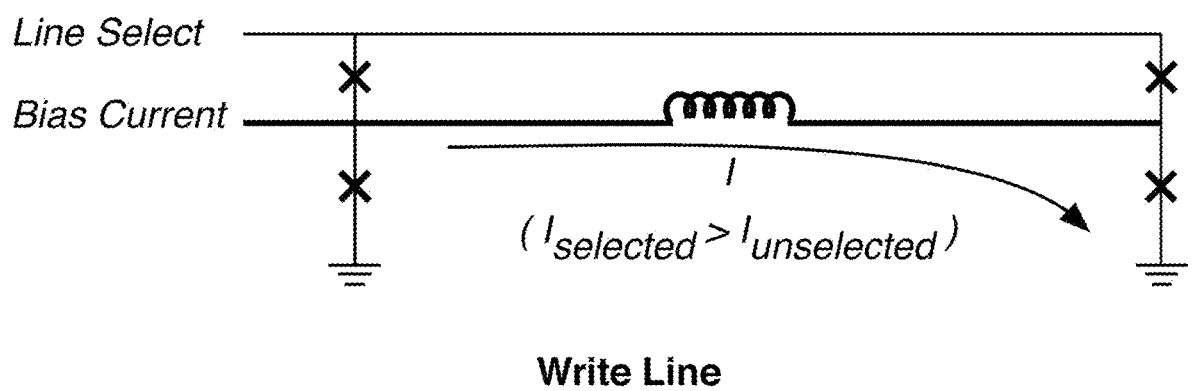
FIG. 29B shows a schematic representation of a write line of the field based MRAM write circuit of FIG. 29A.

In some embodiments, both the rows and columns will be designed using the ERSFQ T flip-flop structure shown in FIG. 29A (memory array) and FIG. 29B (write line). The forward circulating current will be used to adjust the effective magnitude of the current passing through the line. With a sufficiently large ratio of the high and low circulating currents, individual MTJs can be selected within the array. The row is a single large T flip-flop, an aspect that should simplify the interface circuit to the ERSFQ circuits.

It is contemplated that a comprehensive design strategy to size T flip-flop JJ circuits will both enable the MRAM-to-ERSFQ interface to operate at the proper pulse levels, and provide sufficiently high currents to switch the MTJs. Individual rows can be oriented in opposite directions to cancel fields caused by off-state currents. This technique, as well as other physical structures, will be explored to ensure reliability in the presence of stray magnetic fields.

10.4 Storage

The CMOS based peripheral circuits for the storage system will work in a cryogenic environment to reduce the storage access latency, and the heat leaks caused by long wires that connect the cryogenic and room temperature domains. Cooling CMOS circuits within a cryostat causes numerous problems due to the relatively high voltage levels, and the associated power consumption. This issue can be addressed by relocating CMOS circuitry from the 4 K region at the heart of the cryostat to the intermediate cooling stage around the central cryocooler, which has an operating temperature of 77 K to 150 K. This approach improves the cooling efficiency of the system by a factor of two. Moreover, at these temperatures, CMOS exhibits much lower bitline resistance, much high transistor mobility, and near zero leakage current, permitting the circuits to operate much faster and with greater power efficiency than standard room-temperature CMOS circuits.

Because NAND Flash scaling is near the end due to retention time, endurance, and reliability limits, in some embodiments, 3D crosspoint RRAM will be used for the proposed storage system. 3D crosspoint RRAM has many advantages, including faster switching speeds, lower operating voltage, lower write energy, longer endurance, and longer retention time. In addition, the small cell size (4F2/N, where N is the number of stacked layers) makes the density of 3D crosspoint RRAM comparable to high density 3D NAND Flash.

The scalability of crosspoints is affected by the resistance of the device, as well as the resistance of the bitline used to access the device [80]. At 77 K, the copper resistivity drops by a factor of 10.9 [32], reducing the bitline parasitic impedances and increasing the efficiency of the cross point array. In some embodiments, the 3D RRAM storage subsystem will use CMOS for the peripheral circuitry. To achieve the necessary voltage amplification, a two-stage scheme can be employed. A Suzuki stack [76,76], which is a well known latching JJ based voltage amplifier, can be used within the cryostat to communicate to a second-stage CMOS amplifier on the storage chip inside the intermediate cooling stage. Most of the power consumption of a Suzuki stack is static. As a result, an adaptive power gating scheme, based on bus utilization, will reduce power consumption while maintaining performance. In low utilization cases, the interface will be turned off to avoid static power consumption.

Modeling techniques will be needed to simulate CMOS at cryogenic temperatures. These models will drive circuit simulation of individual bus interfaces as well as RRAM crosspoints operating in a cryogenic environment. These models will be used to develop a sizing strategy for the design of RRAM crosspoint arrays.

10.5 Interconnection Network

Figure 30:
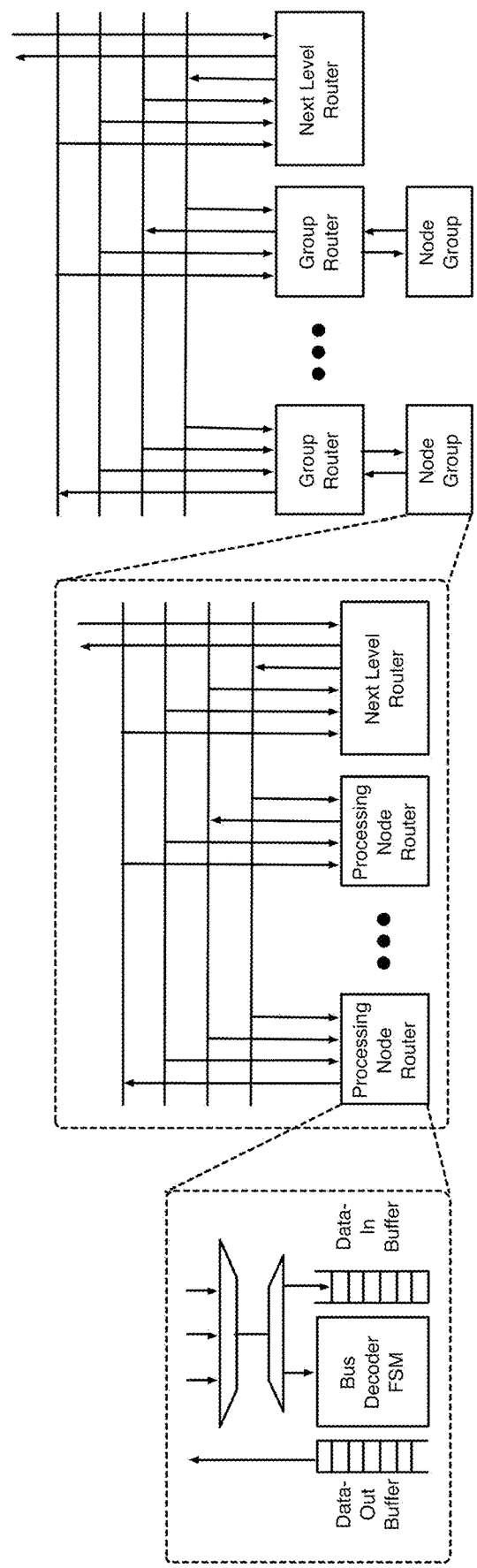
FIG. 30 is a block diagram showing an exemplary interconnection network.

The unique pulse based method of ERSFQ data transmission support interconnection networks that would be highly inefficient in CMOS. It is contemplated that an interconnection network such as is shown in FIG. 30, can be based on a collection of unidirectional buses. Each node will have write (broadcast) access to its own serial data bus, and will monitor the data buses of the other nodes. In CMOS, this scheme produces both power and latency issues due to charging and discharging a long bus. However, because ERSFQ uses voltage pulses rather than voltage levels, data pulses can be transmitted across the bus at high speed and with low power. Because each node has exclusive access to its broadcast bus, there is no possibility of deadlock in this system. Previous work on ERSFQ based interconnection networks has focused on ERSFQ implementations of traditional packet switched routing networks, and has not exploited the unique properties of ERSFQ beyond its inherent high clock frequency.

To simplify router hardware complexity, nodes will access their broadcast bus in a time multiplexed fashion when transmitting read and write requests. In some embodiments, a read or write request will comprise a preamble, followed by a node ID, plus a read or write request. Once a read or write request is received, the node will wait for any ongoing data transmissions to complete, after which it will send an acknowledgment and start the data transfer. Since each node has its own broadcast bus, communication between two nodes will not block communication between any other nodes.

To allow this scheme to scale to many nodes, we will leverage a hierarchical organization. Nodes will be grouped into clusters that can communicate directly with each other, with a global router which will interface to the next level of the hierarchy.

This clustering scheme can delivers higher performance when communication with local nodes within the same cluster is more common than communication with remote nodes in other clusters. Scheduling and management optimizations can be used to take advantage of this quality. Additional logic can also be added to the global router nodes.

Any software or firmware associated with the new superconducting system architectures and devices described herein can be supplied on a computer readable non-transitory storage medium. A computer readable non-transitory storage medium as non-transitory data storage includes any data stored on any suitable media in a non-fleeting manner Such data storage includes any suitable computer readable non-transitory storage medium, including, but not limited to hard drives, non-volatile RAM, SSD devices, CDs, DVDs, etc.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

REFERENCES

[1] Christopher Lawrence Ayala. Energy-Efficient Wide Datapath Integer Arithmetic Logic Units Using Superconductor Logic. PhD thesis, Stony Brook University, December 2012.

[2] D. H. Bailey, E. Barszcz, J. T. Barton, D. S. Browning, R. L. Carter, L. Dagum, R. A. Fatoohi, P. O. Frederickson, T. A. Lasinski, R. S. Schreiber, H. D. Simon, V. VenkataKrishnan, and S. K. Weeratunga. The nas parallel benchmarks summary and preliminary results. In Supercomputing, 1991. Supercomputing '91. Proceedings of the 1991 ACM/IEEE Conference on, pages 158-165, 1991.

[3] Rodwell S Bakolo. Design and Implementation of a RSFQ Superconductive Digital Electronics Cell Library. PhD thesis, University of Stellenbosch, 2011.

[4] Christian Bienia, Sanjeev Kumar, Jaswinder Pal Singh, and Kai Li. The parsec benchmark suite: Characterization and architectural implications. In Proceedings of the 17th International Conference on Parallel Architectures and Compilation Techniques, PACT '08, pages 72-81, 2008.

[5] Darren K Brock, Elie K Track, and John M Rowell. Superconductor ics: the 100-ghz second generation. IEEE Spectrum, 37(12):40-46, 2000.

[6] Christopher Bronk, Avinash Lingamneni, and Krishna Palem. Innovation for sustainability in information and communication technologies (ict). James A. Baker III Inst. Public Policy, Rice Univ., Houston, Tex., USA, 2010.

[7] P. Bunyk, M. Leung, J. Spargo, and M. Dorojevets. Flux-1 rsfq microprocessor: physical design and test results. Applied Superconductivity, IEEE Transactions on, 13(2):433-436, 2003.

[8] H John Caulfield and Shlomi Dolev. Why future supercomputing requires optics. Nature Photonics, 4(5):261-263, 2010.

[9] W Chen, A V Rylyakov, Vijay Patel, J E Lukens, and K K Likharev. Rapid single flux quantum t-flip flop operating up to 770 ghz. IEEE Transactions on Applied Superconductivity, 9(2):3212-3215, 1999.

[10] L. Dagum and R. Menon. Openmp: an industry standard api for shared-memory programming Computational Science Engineering, IEEE, 5(1):46-55, 1998.

[11] M. Dorojevets, C. L. Ayala, and A. K. Kasperek. Data-flow microarchitecture for wide datapath rsfq processors: Design study. Applied Superconductivity, IEEE Transactions on, 21(3):787-791, 2011.

[12] M. Dorojevets, C. L. Ayala, N. Yoshikawa, and A. Fujimaki. 8-bit asynchronous sparse-tree superconductor rsfq arithmetic-logic unit with a rich set of operations. IEEE Transactions on Applied Superconductivity, 23(3): 1700104-1700104, 2013.

[13] M. Dorojevets, P. Bunyk, D. Zinoviev, and K. Likharev. Cool-0: Design of an rsfq subsystem for petaflops computing. Applied Superconductivity, IEEE Transactions on, 9(2):3606-3614, 1999.

[14] M. Dorojevets and P. Bunyk. Architectural and implementation challenges in designing high-performance rsfq processors: a flux-1 microprocessor and beyond. Applied Superconductivity, IEEE Transactions on, 13(2):446-449, 2003.

[15] M. Dorojevets, A. K. Kasperek, N. Yoshikawa, and A. Fujimaki. 20-ghz 8×8-bit parallel carry-save pipelined rsfq multiplier. IEEE Transactions on Applied Superconductivity, 23(3):1300104-1300104, 2013.

[16] M. Dorojevets. A 20-ghz flux-1 superconductor rsfq microprocessor. In Low Temperature Electronics, 2002. Proceedings of the 5th European Workshop on, pages 157-160, 2002.

[17] Noshir B Dubash, Perng-Fei Yuh, Valery V Borzenets, T Van Duzer, and S R Whiteley. Sfq data communication switch. Applied Superconductivity, IEEE Transactions on, 7(2):2681-2684, 1997.

[18] Theodore Van Duzer and Charles William Turner. Principles of Superconductive Devices and Circuits. Prentice Hall PTR, 2 edition, 1999.

[19] M Espy, M Flynn, J Gomez, C Hanson, R Kraus, P Magnelind, K Maskaly, A Matlashov, S Newman, T Owens, M Peters, H Sandin, I Savukov, L Schultz, A Urbaitis, P Volegov, and V Zotev. Ultra-low-field mri for the detection of liquid explosives. Superconductor Science and Technology, 23(3):034023, 2010.

[20] C. A. Hamilton. Josephson voltage standards. Review of Scientific Instruments, 71(10):3611-3623, 2000.

[21] I. Haverkamp, O. Mielke, J. Kunert, R. Stolz, H.-G. Meyer, H. Toepfer, and T. Ortlepp. Linearity of a digital squid magnetometer. Applied Superconductivity, IEEE Transactions on, 21(3):705-708, 2011.

[22] Q. P. Herr and P. Bunyk. Implementation and application of first-in first-out buffers. IEEE Transactions on Applied Superconductivity, 13(2):563-566, 2003.

[23] Yoshio Kameda, Yoshihito Hashimoto, and Shinichi Yorozu. Design and demonstration of a 4×4 sfq network switch prototype system and 10-gbps bit-error-rate measurement. IEICE transactions on electronics, 91(3):333-341, 2008.

[24] Richard D. Lawrence, George S. Almasi, and Holly E. Rushmeier. A scalable parallel algorithm for self-organizing maps with applications to sparse data mining problems. Data Mining and Knowledge Discovery, 3(2):171-195, 1999.

[25] J. Lenz and Alan S. Edelstein. Magnetic sensors and their applications. IEEE Sensors Journal, 6(3):631-649, 2006.

[26] K. K. Likharev and V. K. Semenov. Rsfq logic/memory family: a new josephson-junction technology for sub-terahertz-clock-frequency digital systems. Applied Superconductivity, IEEE Transactions on, 1(1):3-28, 1991.

[27] Linde Kryotechnik AG, http://www.linde-kryotechnik.ch/public/datenblaetter/1280-lr280_datenblatt_eng.pdf. Standard Helium Liquefier/Refrigerator L280/LR280.

[28] J. C. Lin, V. K. Semenov, and K. K. Likharev. Design of sfq-counting analog-to-digital converter. IEEE Transactions on Applied Superconductivity, 5(2):2252-2259, 1995.

[29] Qingguo Liu. Josephson-CMOS hybrid memories. PhD thesis, University of California, Berkeley, April 2007.

[30] Qingguo Liu. Josephson-CMOS hybrid memories. PhD thesis, University of Stellenbosch, 2007.

[31] Sheng Li, Jung-Ho Ahn, R. D. Strong, J. B. Brockman, D. M. Tullsen, and N. P. Jouppi. Mcpat: An integrated power, area, and timing modeling framework for multi-core and manycore architectures. In Microarchitecture, 2009. MICRO-42. 42nd Annual IEEE/ACM International Symposium on, pages 469-480, 2009.

[32] Richard Allen Matula. Electrical resistivity of copper, gold, palladium, and silver. Journal of Physical and Chemical Reference Data, 8:1147, 1979.

[33] J. D. McCambridge, M. G. Forrester, D. L. Miller, B. D. Hunt, J. X. Pryzbysz, J. Talvacchio, and R. M. Young. Multilayer hts sfq analog-to-digital converters. IEEE Transactions on Applied Superconductivity, 7(2):3622-3625, 1997.

[34] Micron Technology, Inc., http://download.micron.com/pdf/datasheets/dram/ddr3/1Gb_DDR3_SDRAM.pdf. 1Gb DDR3 SDRAM, 2006.

[35] MV Moody, HA Chan, and H J Paik. Superconducting gravity gradiometer for space and terrestrial applications. Journal of applied physics, 60(12):4308-4315, 1986.

[36] MOSIS, http://www.mosis.com/pages/products/assembly/index. MOSIS Packaging And Assembly: Packaging Options, 2013.

[37] O. A. Mukhanov, D. Gupta, A. M. Kadin, and V. K. Semenov. Superconductor analog-to-digital converters. Proceedings of the IEEE, 92(10):1564-1584, 2004.

[38] O. A. Mukhanov. Energy-efficient single flux quantum technology. IEEE Transactions on Applied Superconductivity, 21(3):760-769, 2011.

[39] Oleg A. Mukhanov, Alan M. Kadin, Ivan P. Nevirkovets, and Igor V. Vernik. Superconducting devices with ferromagnetic barrier junctions, January 2012. U.S. Patent Appl. 2012/0184445 A1.

[40] Naveen Muralimanohar, Rajeev Balasubramonian, and Norman P Jouppi. Cacti 6.0: A tool to model large caches. HP Laboratories, 2009.

[41] T. Nakagawa, Y. Hashimoto, Y Kameda, S. Yorozu, M. Hidaka, and Kazunori Miyahara. Large-scale sfq switches using miniaturized 2 2 switch cell. Applied Superconductivity, IEEE Transactions on, 18(4):1790-1796, 2008.

[42] M Nisenoff. Space applications of superconductivity. Principles and applications of superconducting quantum interference devices, page 275, 1992.

[43] H. Numata, S. Nagasawa, and S. Tahara. A vortex transitional memory cell for 1-mbit/cm/sup 2/density josephson rams. Applied Superconductivity, IEEE Transactions on, 7(2):2282-2287, 1997.

[44] T Ortlepp, L Zheng, S R Whiteley, and T Van Duzer. Design guidelines for suzuki stacks as reliable high-speed josephson voltage drivers. Superconductor Science and Technology, 26(3):035007, 2013.

[45] S V Polonsky. New sfq/dc converter for rsfq logic/memory family Superconductor Science and Technology, 4(9):442.

[46] Torsten Reich, T. Ortlepp, and F. Hermann Uhlmann. Digital squid sensor based on sfq technique. IEEE Transactions on Applied Superconductivity, 15(2):304-307, 2005.

[47] Jose Renau, Basilio Fraguela, James Tuck, Wei Liu, Milos Prvulovic, Luis Ceze, Smruti Sarangi, Paul Sack, Karin Strauss, and Pablo Montesinos. SESC simulator, January 2005. http://sesc.sourceforge.net.

[48] K. Rupp and S. Selberherr. The economic limit to moore's law. IEEE Transactions on Semiconductor Manufacturing, 24(1):1-4,2011.

[49] Valery V. Ryazanov, Vitaly V. Bol'ginov, Danila S. Sobanin, Igor V. Vernik, Sergey K. Tolpygo, Alan M. Kadin, and Oleg A. Mukhanov. Magnetic josephson junction technology for digital and memory applications. Physics Procedia, 36(0):35-41, 2013.

[50] H. Sasaki, S. Kiryu, F. Hirayama, T. Kikuchi, M. Maezawa, A. Shoji, and S. V. Polonsky. Rsfq-based d/a converter for ac voltage standard. IEEE Transactions on Applied Superconductivity, 9(2):3561-3564,1999.

[51] V. K. Semenov and M. A. Voronova. Dc voltage multipliers: a novel application of synchronization in josephson junction arrays. IEEE Transactions on Magnetics, 25(2):1432-1435, 1989.

[52] Wilson Snyder, Duane Galbi, and Paul Wasson. Verilator Wiki. http://www.veripool.org/wiki/verilator.

[53] M. Suzuki, M. Maezawa, H. Takato, H. Nakagawa, F. Hirayama, S. Kiryu, M. Aoyagi, T. Sekigawa, and A. Shoji. An interface circuit for a josephson-cmos hybrid digital system. Applied Superconductivity, IEEE Transactions on, 9(2):3314-3317, 1999.

[54] S. E. Thompson. Power, cost and circuit ip reuse: The real limiter to moore's law over the next 10 years. In VLSI Technology Systems and Applications (VLSI-TSA), 2010 International Symposium on, pages 88-89,2010.

[55] Y. Tsuga, Y. Yamanashi, and N. Yoshikawa. Asynchronous digital squid magnetometer with an on-chip magnetic feedback for improvement of magnetic resolution. IEEE Transactions on Applied Superconductivity, 23(3): 1601405-1601405,2013.

[56] T. Van Duzer, Lizhen Zheng, S. R. Whiteley, H. Kim, Jaewoo Kim, Xiaofan Meng, and T. Ortlepp. 64-kb hybrid josephson-cmos 4 kelvin ram with 400 ps access time and 12 mw read power. Applied Superconductivity, IEEE Transactions on, 23(3):1700504-1700504, 2013.

[57] I. V. Vernik, V. V. Bol'ginov, S. V. Bakurskiy, A. A. Golubov, M. Y. Kupriyanov, V. V. Ryazanov, and O. A. Mukhanov. Magnetic josephson junctions with superconducting interlayer for cryogenic memory. IEEE Transactions on Applied Superconductivity, 23(3):1701208-1701208, 2013.

[58] S. J E Wilton and N. P. Jouppi. Cacti: an enhanced cache access and cycle time model. Solid-State Circuits, IEEE Journal of, 31(5):677-688, 1996.

[59] S. C. Woo, M. Ohara, E. Torrie, J. P. Singh, and A. Gupta. The splash-2 programs: characterization and methodological considerations. In Computer Architecture, 1995. Proceedings., 22nd Annual International Symposium on, pages 24-36, 1995.

[60] T Yamada, M Yoshida, T Hanai, A Fujimaki, H Hayakawa, Y Kameda, S Yorozu, H Terai, and N Yoshikawa. Quantitative evaluation of the single-flux-quantum cross/bar switch. Applied Superconductivity, IEEE Transactions on, 15(2):324-327, 2005.

[61] Y. Yamanashi, M. Tanaka, A. Akimoto, H. Park, Y Kamiya, N. Irie, N. Yoshikawa, A. Fujimaki, H. Terai, and Y. Hashimoto. Design and implementation of a pipelined bit-serial sfq microprocessor, core1. Applied Superconductivity, IEEE Transactions on, 17(2):474-477, 2007.

[62] R. M. Yoo, A. Romano, and C. Kozyrakis. Phoenix rebirth: Scalable mapreduce on a large-scale shared-memory system. In Workload Characterization, 2009. IISWC 2009. IEEE International Symposium on, pages 198-207, 2009.

[63] Shinichi Yorozu, Yoshio Kameda, and Shuichi Tahara. A single flux quantum (sfq) packet switch unit towards scalable non-blocking router. IEICE transactions on electronics, 85(3):617-620, 2002.

[64] S Yorozu, Y Hashimoto, Y Kameda, H Terai, A Fujimaki, and N Yoshikawa. A 40 ghz clock 160 gb/s 4 4 switch circuit using single flux quantum technology for high-speed packet switching systems. In High Performance Switching and Routing, 2004. HPSR. 2004 Workshop on, pages 20-23. IEEE, 2004.

[65] S. Yorozu, Y Kameda, Y. Hashimoto, H. Terai, A. Fujimaki, and N. Yoshikawa. Single flux quantum circuit technology innovation for backbone router applications. Physica C: Superconductivity, 392-396, Part 2(0):1478-1484, 2003.

[66] S. Yorozu, Y Kameda, Y. Hashimoto, H. Terai, A. Fujimaki, and N. Yoshikawa. Progress of single flux quantum packet switch technology. Applied Superconductivity, IEEE Transactions on, 15(2):411-414, 2005.

[67] W. Zhao and Y. Cao. New generation of predictive technology model for sub-45 nm early design exploration. IEEE Transactions on Electron Devices, 53(11):2816-2823, January 2006.

[68] J E Zimmerman. Space applications of superconductivity: Low frequency superconducting sensors. Cryogenics, 20(1):3-10, 1980.

[69] D. Y. Zinoviev and K. K. Likharev. Feasibility study of rsfq-based self-routing nonblocking digital switches. Applied Superconductivity, IEEE Transactions on, 7(2): 3155-3163, 1997.

[70] V. S. Zotev, A. N. Matlachov, P. L. Volegov, H. J. Sandin, M. A. Espy, J. C. Mosher, A. V. Urbaitis, S. G. Newman, and Robert H. Kraus. Multi-channel squid system for meg and ultra-low-field mri. Applied Superconductivity, IEEE Transactions on, 17(2):839-842, 2007.

[71] V. S. Zotev, A. N. Matlashov, P. L. Volegov, A. V. Urbaitis, M. A. Espy, and R. H. Kraus Jr. Squid-based instrumentation for ultralow-field mri. Superconductor Science and Technology, 20(11):5367, 2007.

[72] Microtesla {MRI} of the human brain combined with {MEG}. Journal of Magnetic Resonance, 194(1):115-120, 2008.

[73] K. Gaj, Q. P. Herr, V. Adler, A. Krasniewski, E. G. Friedman, and M. J. Feldman Tools for the computer-aided design of multigigahertz superconducting digital circuits. Applied Superconductivity, IEEE Transactions on, 9(1):18-38, 1999.

[74] K. Gaj, E. G. Friedman, M. J. Feldman, and A. Krasniewski. A clock distribution scheme for large rsfq circuits. Applied Superconductivity, IEEE Transactions on, 5(2):3320-3324, 1995.

[75] A. H. Silver. Superconductor technology for high-end computing system issues and technology roadmap. In Supercomputing, 2005. Proceedings of the ACM/IEEE SC 2005 Conference, pages 64-64, 2005.

[76] B. N. Engel et. al. A 4-mb toggle mram based on a novel bit and switching method. IEEE Transactions on Magnetics, 41(1):132-136, January 2005.

[77] M. Hosomi and H. Yamagishi and T. Yamamoto and K. Bessha et al. A novel nonvolatile memory with spin torque transfer magnetization switching: Spin-RAM. In IEDM Technical Digest, pages 459-462,2005.

[78] T. Kishi et al. Lower-current and fast switching of a perpendicular TMR for high speed and high density spin-transfer-torque MRAM. In Proceedings of the IEEE International Electron Devices Meeting, pages 1-4, January 2008.

[79] T. Kawahara et al. 2 Mb SPRAM (spin-transfer torque RAM) with bit-by-bit bi-directional current write and parallelizing-direction current read. IEEE Journal of Solid-State Circuits, 43(1):109-120, January 2008.

[80] J. Liang, S. Yeh, S. S. Wong, and H. S. P. Wong. Effect of wordline/bitline scaling on the performance, energy consumption, and reliability of cross-point memory array. J. Emerg. Technol. Comput. Syst., 9(1):9:1-9:14, February 2013.

What is claimed is:

1. An energy efficient rapid single flux quantum (ERSFQ) logic register wheel comprising:
    a circular shift register having a plurality of destructive read out (DRO) cells, each entry of said circular shift register comprising a data block, a tag, and a valid bit which advance by one entry every cycle of the register wheel;
    a compare and control logic coupled to said circular shift register to compare a source specifier or a destination register specifier against a register tag stored in the wheel following each cycle of the register wheel;
    at least one or more read ports and at least one or more write ports, coupled to said circular shift register to write to or to read from a different entry each in the register wheel following each cycle of the register wheel; and
    wherein said logic wheel comprises a Josephson junction (JJ) based energy ERSFQ logic disposed in a cryostat which maintains cryogenic temperatures.

2. The ERSFQ logic register wheel of claim 1, wherein said ERSFQ logic wheel progresses through said circular register at a frequency of more than twice a core clock frequency of an associated processor to reduce average access latency.

3. The ERSFQ logic register wheel of claim 1, wherein said ERSFQ logic register wheel further comprises at least one or more additional read port comprising a single JJ junction.

4. The ERSFQ logic register wheel of claim 1, wherein said ERSFQ logic register wheel further comprises at least one or more additional write port comprising three JJ junctions.

5. The ERSFQ logic register wheel of claim 1, wherein said ERSFQ logic register wheel comprises a random access memory (RAM) or a content addressed memory (CAM).

6. The ERSFQ logic register wheel of claim 1, wherein said ERSFQ logic register wheel comprises a ERSFQ logic store wheel wherein each entry of said circular shift register further comprises an additional bit flag and said ERSFQ logic register wheel further comprises at least one or more search ports.

7. The ERSFQ logic store wheel of claim 6, wherein said ERSFQ logic store wheel comprises an ERSFQ logic miss store holding register (MSHR) wheel.

8. The ERSFQ logic MSHR wheel of claim 7, wherein said MSHR wheel comprises a CAM wheel with an address field for comparison and two fields for secondary misses.

9. The ERSFQ logic register wheel of claim 1, wherein at least one or more of said ERSFQ logic register wheels provide a register file access component of a processor which is coupled to a decode component by asynchronous FIFOs and where said register file access component provides instructions to an execution component via asynchronous FIFOs such that each of said decode component, said register file access component, and said execution component can run at different clock rates.

10. The ERSFQ logic register wheel of claim 1, further comprising a multiported store queue as a write buffer.

11. The ERSFQ logic register wheel of claim 1, wherein at least one or more ERSFQ logic register wheels provide a load queue to support recovery from branch mispredictions.

12. The ERSFQ logic register wheel of claim 11, wherein a first load wheel holds load instructions that have not yet been issued to a memory or searched by a store wheel and a second wheel holds loads after they are issued to a memory subsystem until they are committed.

* * * * *